(12) United States Patent
Barabash et al.

(10) Patent No.: US 8,907,314 B2
(45) Date of Patent: Dec. 9, 2014

(54) MOOX-BASED RESISTANCE SWITCHING MATERIALS

(71) Applicant: Intermolecular, Inc., San Jose, CA (US)

(72) Inventors: Sergey Barabash, San Jose, CA (US); Tony P. Chiang, Campbell, CA (US); Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 85 days.

(21) Appl. No.: 13/727,958

(22) Filed: Dec. 27, 2012

(65) Prior Publication Data

US 2014/0183432 A1 Jul. 3, 2014

(51) Int. Cl.
*H01L 29/02* (2006.01)
*H01L 45/00* (2006.01)

(52) U.S. Cl.
CPC .................................. *H01L 45/145* (2013.01)
USPC ...... 257/2; 257/3; 257/4; 257/5; 257/E29.002; 438/102; 438/103; 438/104

(58) Field of Classification Search
USPC .................. 257/1–5, E29.002; 438/102–104; 365/163
See application file for complete search history.

(56) References Cited

U.S. PATENT DOCUMENTS

| | | | |
|---|---|---|---|
| 3,883,887 A | 5/1975 | Robinson, Sr. | |
| 6,534,784 B2 | 3/2003 | Eliasson et al. | |
| 7,816,659 B2 | 10/2010 | Herner et al. | |
| 8,116,116 B2 | 2/2012 | Hwang et al. | |
| 8,143,092 B2 | 3/2012 | Kumar et al. | |
| 8,598,560 B1 * | 12/2013 | Milojevic et al. | 257/2 |
| 8,637,413 B2 * | 1/2014 | Chen et al. | 438/784 |
| 2006/0171200 A1 | 8/2006 | Rinerson et al. | |
| 2006/0263289 A1 | 11/2006 | Heo et al. | |
| 2010/0021626 A1 | 1/2010 | Hsieh et al. | |
| 2010/0072499 A1 | 3/2010 | Kwon et al. | |
| 2011/0089393 A1 | 4/2011 | Chang et al. | |
| 2011/0175050 A1 | 7/2011 | Chien et al. | |
| 2012/0168705 A1 | 7/2012 | Liu et al. | |
| 2012/0171835 A1 | 7/2012 | Liu et al. | |
| 2013/0334483 A1 * | 12/2013 | Ramaswamy et al. | 257/2 |

FOREIGN PATENT DOCUMENTS

WO 2012100502 A1 8/2012

OTHER PUBLICATIONS

Smyth; The defect chemistry or metal oxides; 2000; Oxford University Press; Chapters 1-5, 8, 9 and 12; pp. 1-74, 118-161 and 217-237.
Park et al.; Reproducible resistive switching in nonstoichiometric nickel oxide films grown by rf reactive sputtering for resistive random access memory applications; Jul. 22, 2005; Journal of Vacuum Science & Technology A, vol. 23, No. 5; American Vacuum Society; pp. 1309-1313.

(Continued)

*Primary Examiner* — Jami M Valentine

(57) ABSTRACT

Molybdenum oxide can be used to form switching elements in a resistive memory device. The atomic ratio of oxygen to molybdenum can be between 2 and 3. The molybdenum oxide exists in various Magneli phases, such as $Mo_{13}O_{33}$, $Mo_4O_{11}$, $Mo_{17}O_{47}$, $Mo_8O_{23}$, or $Mo_9O_{26}$. An electric field can be established across the switching layers, for example, by applying a set or reset voltage. The electric field can cause movement of the oxygen charges, e.g., $O^{2-}$ ions, changing the composition profile of the switching layers, forming bistable states, including a high resistance state with $MoO_3$ and a low resistance state with $MoO_x$ (x<3).

14 Claims, 24 Drawing Sheets

(56) References Cited

OTHER PUBLICATIONS

Kuo et. al.; Characterization of nonstoichiometric TiO2 and ZrO2 thin films stabilized by Al2O3 and SiO2 additions; Oct. 24, 2003; Journal of Vacuum Science & Technology A, vol. 21, No. 6; American Vacuum Society; pp. 1996-2002.

Beck, A., et al.; Reproducible Switching Effect in Thin Oxide Films for Memory Applications; Jul. 3, 2000; American Institute of Physics; Applied Physics Letters, vol. 77, No. 1; pp. 139-141.

Lee, et al.; Effect of Nonstoichiometry of Nickel Oxides on Their Supercapacitor Behavior; Aug. 30, 2004; The Electrochemical Society; Electrochemical and Solid-State Letters, vol. 7, No. 10; pp. A299-A301.

Seo, S., et al.; Reproducible Resistance Switching in Polycrystalline NiO Films; Dec. 6, 2004; Applied Physics Letters, vol. 85, No. 23; American Institute of Physics; pp. 5655-5657.

Lopes, J., et al.; Amorphous Lanthanum Lutetium Oxide Thin Films as an Alternative High-k Gate Dielectric; Nov. 27, 2006; American Institute of Physics; Applied Physics Letters; pp. 222902-1-222902-3.

Robertson, J.; High Dielectric Constant Gate Oxides for Metal Oxide Si Transistors; Dec. 14, 2005; Institute of Physics Publishing; Reports on Progress in Physics; pp. 327-396.

Okumu, J., et al.; In Situ Measurements of Thickness Changes and Mechanical Stress Upon Gasochromic Switching of Thin MoOx Films; Jun. 15, 2004; American Institute of Physics; Journal of Applied Physics, vol. 95, No. 12; pp. 7632-7636.

Lee, D., et al.; Resistance Switching of Copper Doped MoOx Films for Nonvolatile Memory Applications; Mar. 20, 2007; American Institute of Physics; Applied Physics Letters; pp. 122104-1-122104-3.

* cited by examiner

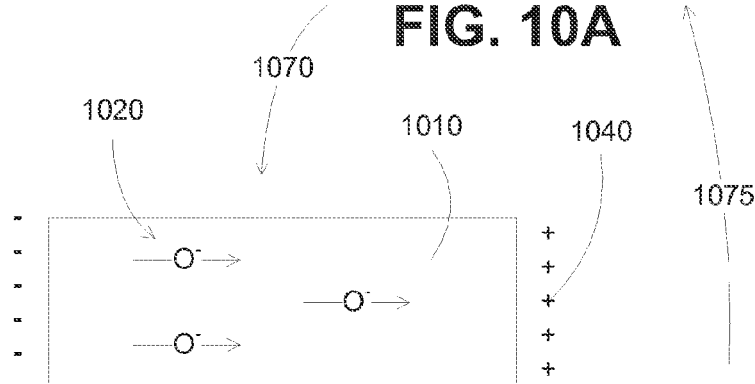
FIG. 10A
FIG. 10B
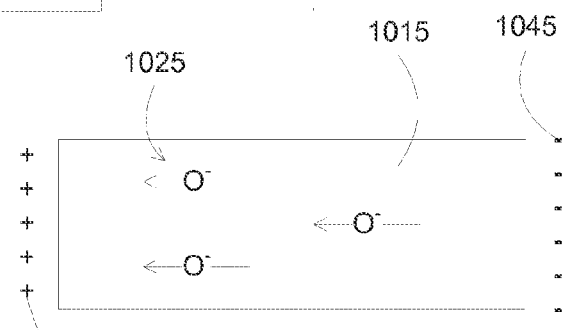
FIG. 10C
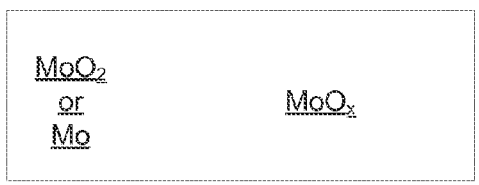
FIG. 10D

MOOX-BASED RESISTANCE SWITCHING MATERIALS

FIELD OF THE INVENTION

This invention relates generally to nonvolatile memory elements, and more particularly, to methods for forming resistive switching memory elements used in nonvolatile memory devices

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive memory device, e.g., resistive switching nonvolatile random access memory (ReRAM) is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

The voltage and current required to initially form conducting filaments in a ReRAM device is typically higher than that required for subsequent switching, leading to substantial power consumption during the forming process.

Therefore, there is a need for a resistive memory structure that can meet the design criteria for advanced memory devices.

SUMMARY

In some embodiments, switching layers in resistive random access memories and methods to form the switching layers are provided. The switching layer can include molybdenum oxide in which the atomic ratio of oxygen to molybdenum is between 2 and 3. For example, the chemical formula for molybdenum oxide can be MoOx, with x between 2 and 3. In some embodiments, the molybdenum oxide can exist in Magnéli phases, such as $Mo_{13}O_{33}$, $Mo_4O_{11}$, $Mo_{17}O_{47}$, $Mo_8O_{23}$, or $Mo_9O_{26}$. In some embodiments, the switching layer can include molybdenum oxide regions in which the atomic ratio of oxygen to molybdenum is less than 2, e.g., between metallic molybdenum (ratio is 0) to molybdenum dioxide (ratio is 2), together with regions in which the atomic ratio of oxygen to molybdenum is between 2 and 3. In some embodiments, the atomic ratio of oxygen to molybdenum can monotonously vary (increase or decrease) along the switching region.

During an operation of the resistive random access memories, an electric field can be established across the switching layers, for example, by applying a set or reset voltage. The electric field can cause movement of the oxygen charges, e.g., $O^{2-}$ ions, changing the composition profile of the switching layers.

In some embodiments, the switching layer can be deposited as a bi-layer of a first region of molybdenum or molybdenum dioxide and a second region of molybdenum oxide with the atomic ratio of oxygen to molybdenum in the molybdenum oxide between 2 and 3. In some embodiments, the switching layer can be deposited as a bi-layer of a first region of molybdenum trioxide and a second region of molybdenum oxide with the atomic ratio of oxygen to molybdenum in the molybdenum oxide less than 3. In some embodiments, the switching layer can be deposited as a tri-layer of a first region of molybdenum or molybdenum dioxide, a second region of molybdenum oxide with the atomic ratio of oxygen to molybdenum in the molybdenum oxide between 2 and 3, and a third region of molybdenum trioxide. During device operation, the switching region can include various molybdenum oxide phases, not limited to the ones used during deposition.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 10A-10D illustrate an example of oxygen movement in a $MoO_x$ dielectric layer according to some embodiments.

DETAILED DESCRIPTION

Figure 1:
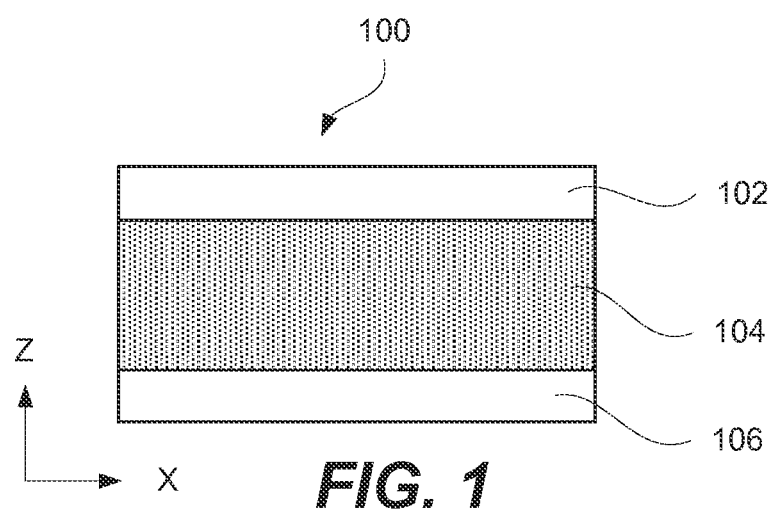
FIG. 1 illustrates a schematic representation of a ReRAM cell according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The switching element in a resistive random access memory (ReRAM) device can form bistable states, e.g., in the form of conducting filaments. The bistable states can be generated by an applied voltage, which can change the resistance of the switching element from a low value to a high value (reset voltage) or can change the resistance of the switching element from a high value to a low value (set voltage).

In some embodiments, switching elements utilizing molybdenum oxides can be provided. Molybdenum oxides can have many different phases, depending on the available oxygen in the material. In some embodiments, the atomic ratio of oxygen to molybdenum can monotonously vary (increase or decrease) along the switching region. Further, under the influence of an applied electric field, e.g., due to an applied voltage, oxygen ions can move in the molybdenum oxide layer, leading to potential phase changes of molybdenum oxides. Different phases of molybdenum oxides can have different resistivity, and thus the transition between different phases of molybdenum oxides can be used to form resistive switching elements. For example, by applying a positive voltage to an end of a resistive switching layer containing $MoO_x$, a layer of $MoO_3$ can be formed at the voltage end, due to the attracting movement of oxygen charges. Similarly, by applying a negative voltage to an end of a resistive switching layer containing $MoO_x$, a layer of $MoO_2$ can be formed at the voltage end, due to the repelling movement of oxygen charges.

In some embodiments, ReRAM device design is provided that can include $MoO_x$ as a switching element in the memory stack. Oxygen ions in the $MoO_x$ component can move in responded to an applied voltage, forming bistable states of ReRAM devices.

A ReRAM cell exhibiting resistive switching characteristics generally includes multiple layers formed into a stack. The stack includes two conductive layers operating as electrodes. These layers may include metals and/or other conductive materials. The stack also includes a poorly conducting layer disposed in between the electrodes. The poorly conducting layer exhibits resistive switching properties characterized by different resistive states of the material forming this layer. As such, this poorly conducting layer can be referred to as a resistive switching layer. These resistive states may be used to represent one or more bits of information. The resistance switching properties of the poorly conducting layer can depend on the distribution and/or exact geometric location of various atoms or ions, such as oxygen ions, inside this layer. For example, different distribution of oxygen ions throughout the layer may reflect different resistance states of the layer, and these states may be sufficiently stable for memory application.

The resistive switching layer changes its resistive state when a certain switching voltage (e.g., a set voltage or a reset voltage) is applied to this layer as further explained below. The applied voltage can cause localized heating within the layer and/or at one of both of its interfaces with other components. Without being restricted to any particular theory, it is believed that a combination of the electrical field and localized heating (both created by the applied voltage) can cause formation and breakage of various conductive paths within the resistive switching layer and/or at its interfaces. (Note that excessive heating may not be necessary and may be detrimental in some operation regimes, as discussed below.) These conductive paths may be established and broken by moving oxygen ions within the resistive switching layer and through one or more interfaces that resistive switching layer forms with adjacent layers, thereby changing the local concentration of oxygen ions which in turn changes the local conductivity along the filament.

A brief description of ReRAM cell operation is provided for better understanding of various features and structures associated with methods of forming nonvolatile memory elements further described below. ReRAM is a non-volatile memory type that includes dielectric material exhibiting resistive switching characteristics, which can, e.g., be disposed in between two electrodes. In some embodiments, a dielectric, which is normally insulating or very poorly conducting, can be made to conduct, either throughout the entire bulk, or more frequently through one or more filaments or conduction paths formed after application of a sufficiently high voltage to the electrodes. Once the one or more filaments or conduction paths are formed in the dielectric component of a memory device, these filaments or conduction paths may be reset (or broken resulting in a high resistance) or set (or re-formed resulting in a lower resistance) by applying certain voltages; the corresponding states of the resistive switching layer (including the state of the filaments) are then referred to as a high resistance state (HRS), and a low resistance state (LRS), respectively. In some embodiments, the dielectric layer can switch between HRS and LRS without having to form well-defined filaments. Switching from LRS to HRS is often referred to as a reset operation, and switching from HRS to LRS is often referred to as a set operation. Setting and resetting operations may be repeated multiple times.

Without being restricted to any particular theory, it is believed that resistive switching corresponds to migration of oxygen ions within the resistive switching layer and, in some embodiments, across one interface formed by the resistive switching voltage, when a switching voltage is applied to the layer.

When the dielectric layer contains conducting filaments, the resistance difference between the LRS and HRS can be due to different number and/or conductivity of the filaments that exists in these states, i.e., a resistive switching layer can have more conductive paths and/or less resistive conductive paths when it is in the LRS than when it is in the HRS. It should be noted that resistive switching layer may still have some conductive paths while it is in the HRS, but these conductive paths may be fewer and/or more resistive than the ones corresponding to the LRS.

FIG. 1 illustrates a schematic representation of a ReRAM cell according to some embodiments. A basic building unit of a memory device is a stack having a capacitor like structure. A ReRAM cell includes two electrodes and a dielectric positioned in between these two electrodes. Specifically, a ReRAM cell 100 includes top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

Top electrode 102 and bottom electrode 106 may be used as conductive lines within a memory array or other types of devices that ReRAM cell is integrated into. As such, electrode 102 and 106 are generally formed from conductive materials.

Figure 2A:
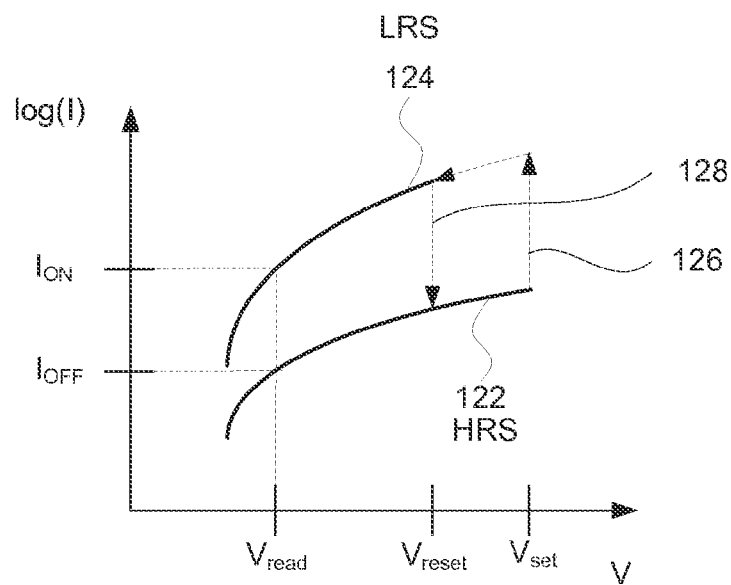
FIG. 2A illustrates a plot of a current passing through a unipolar ReRAM cell as a function of a voltage applied to the ReRAM cell, in accordance with some embodiments.
Figure 2B:
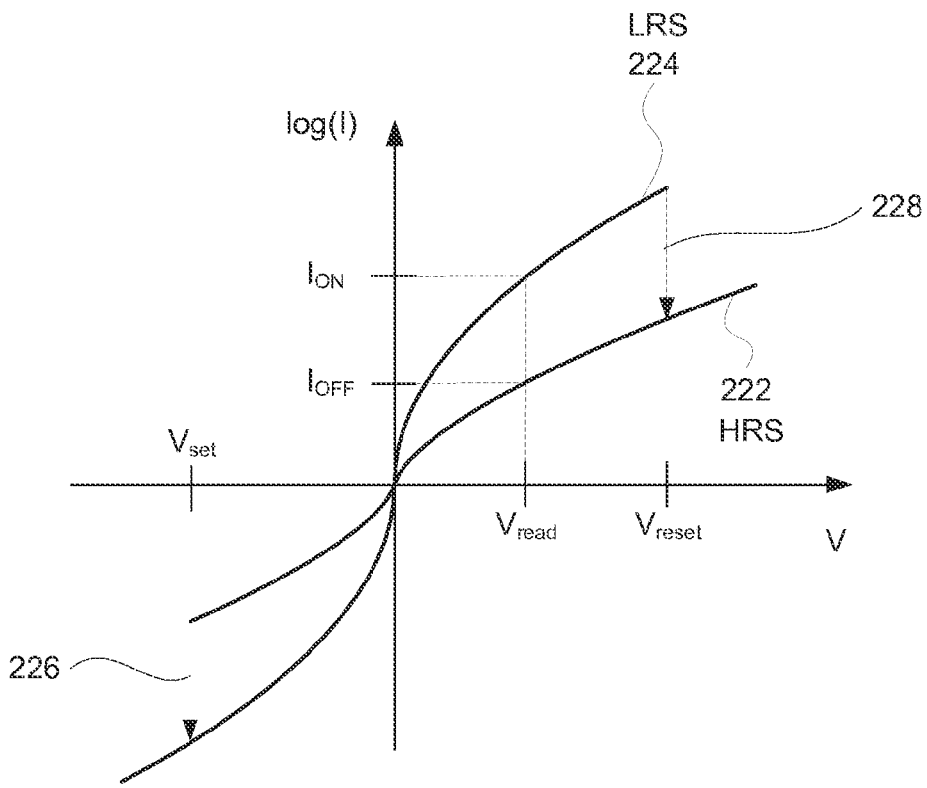
FIG. 2B illustrates the same type of a plot for a bipolar ReRAM cell, in accordance with some embodiments.

FIG. 2 illustrates the dependence of a current I passing through a ReRAM cell on the applied voltage V for different types of ReRAM cells. It should be noted that polarity of the reset voltage and the set voltage may be the same as shown in FIG. 2A or different as shown in FIG. 2B. The cells that have the same polarity of set and reset voltages are referred to as unipolar cells, while the cells that have different polarities of h set and reset voltages are referred to as bipolar cells. One having ordinary skills in the art would understand that notwithstanding the axes labels, the plots in FIG. 2 may use a custom scale for the sake of visual clarity, such as showing $-\log(|I|)$ instead of $\log(I)$ at negative voltages, or such as not visualizing the log(I) values for very small I values, etc. In general, these plots are not to scale and only serve as illustrations.

FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in FIG. 2A and by lines 222 and 224 respectively in FIG. 2B. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistance switching layer can be sensed by applying a sensing voltage to its electrodes. The sensing voltage is sometimes referred to as a "READ" voltage or simply a reading voltage and indicated as $V_{READ}$ in FIGS. 2A and 2B. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistance switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistance switching layer. Switching from a LRS to HRS is indicated by dashed line 128 in FIG. 2A and line 228. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all.

The ReRAM cells can be configured in a cross point memory array. The cross point memory arrays can include horizontal word lines that cross vertical bit lines. Memory cells can be located at the cross points of the word lines and the bit lines. The memory cells can function as the storage elements of a memory array.

Figure 3:
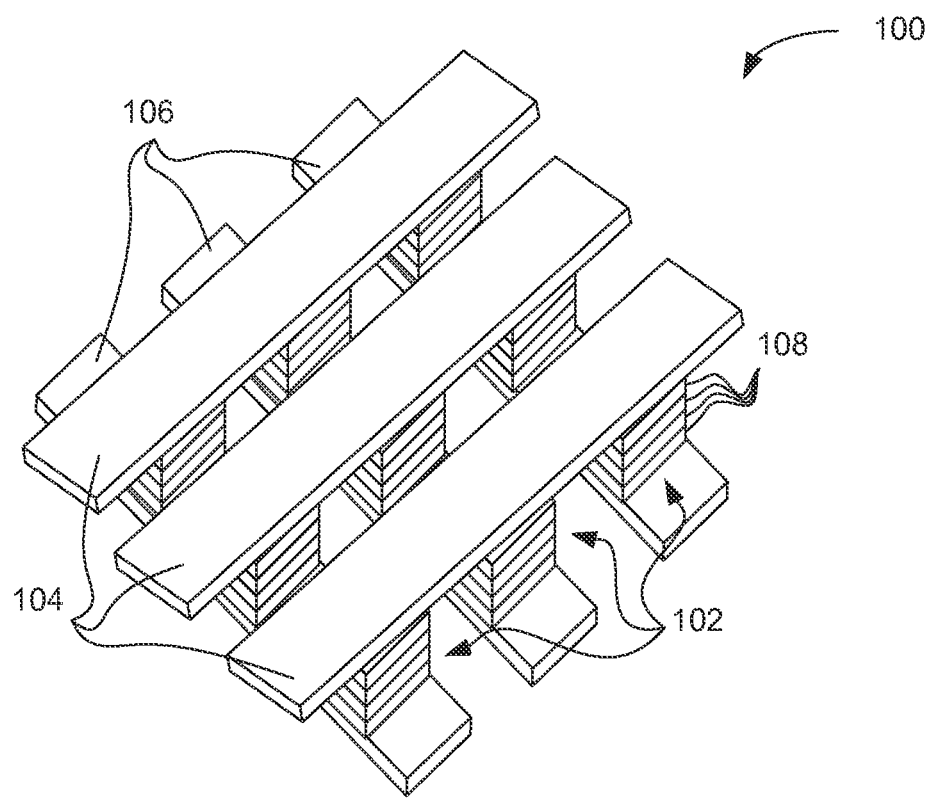
FIG. 3 illustrates a memory array of resistive switching memory elements according to some embodiments.

FIG. 3 illustrates a memory array of resistive switching memory elements according to some embodiments. Memory array 300 may be part of a memory device or other integrated circuit. Memory array 300 is an example of potential memory configurations; it is understood that several other configurations are possible.

Read and write circuitry may be connected to memory elements 302 using signal lines 304 and orthogonal signal lines 306. Signal lines such as signal lines 304 and signal lines 306 are sometimes referred to as word lines and bit lines and are used to read and write data into the elements 302 of array 300. Individual memory elements 302 or groups of memory elements 302 can be addressed using appropriate sets of signal lines 304 and 306. Memory element 302 may be formed from one or more layers 308 of materials, as is described in further detail below. In addition, the memory arrays shown can be stacked in a vertical fashion to make multi-layer 3-D memory arrays.

Any suitable read and write circuitry and array layout scheme may be used to construct a non-volatile memory device from resistive switching memory elements such as element 302. For example, horizontal and vertical lines 304 and 306 may be connected directly to the terminals of resistive switching memory elements 302. This is merely illustrative.

During the operation of the cross point memory array, such as a read operation, the state of a memory element 302 can be sensed by applying a sensing voltage (i.e., a "read" voltage) to an appropriate set of signal lines 304 and 306. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 304 and 306.

Resistive memory devices using molybdenum oxide based material as switching elements are provided. Molybdenum oxide ($MoO_x$) occurs in a number of different phases, from molybdenum dioxide ($MoO_2$) to molybdenum trioxide ($MoO_3$), and many so-called Magnéli phases in between. In some embodiments, molybdenum oxide can be also encountered in amorphous, defect-saturated, or other metastable phases.

Figure 4A:
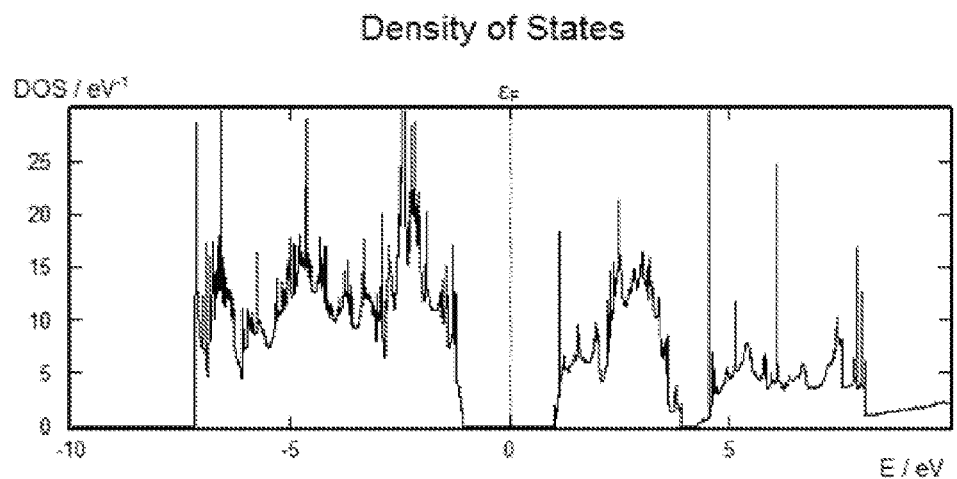
FIGS. 4A-4C illustrate the density of states for different phases of molybdenum oxide as can be used in some embodiments.
Figure 4B:
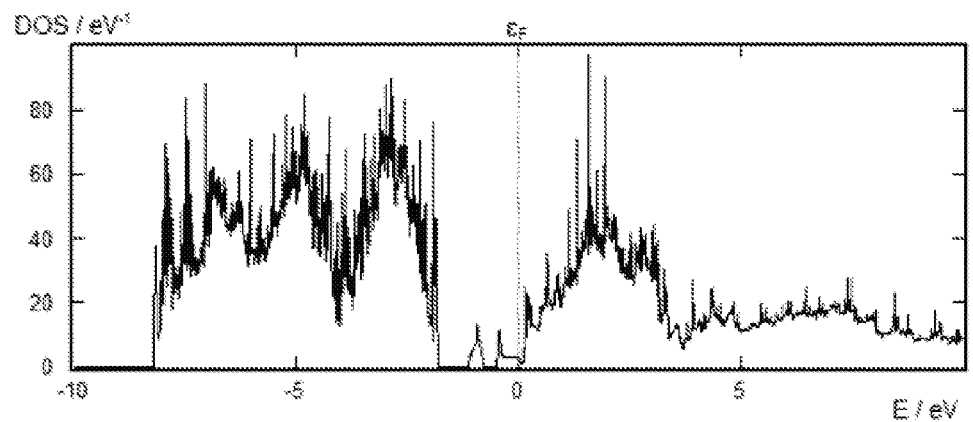
Figure 4C:
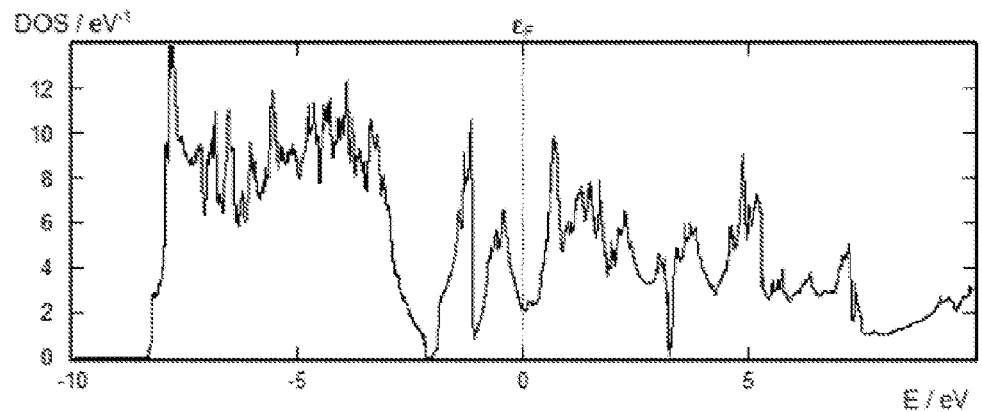

FIGS. 4A-4C illustrate the density of states for different phases of molybdenum oxide as can be used in some embodiments. The density of states is calculated in the local density approximation for experimentally reported atomic positions, using linear combination of atomic orbitals ab initio approach. FIG. 4A shows the molybdenum trioxide $MoO_3$, which is insulating, and its electronic density of states showing a wide gap between the 0-derived valence band and Mo-derived conduction band, with the bulk Fermi level (E=0) near the middle of the gap.

The Magnéli phases can include $MoO_x$, with x between 2 and 3, such as $Mo_{13}O_{33}$, $Mo_4O_{11}$, $Mo_{17}O_{47}$, $Mo_8O_{23}$, $Mo_9O_{26}$, etc. FIG. 4B shows the density of states of a representative of the Magnéli phases, showing additional Mo states below the energies that corresponded to the conduction band minimum in $MoO_3$, and the Fermi level falls into the region where these additional states appear. Accordingly, the Magnéli phases are known to be poor conductors.

The rutile $MoO_2$ phase is highly conducting. FIG. 4C shows that $MoO_2$ possesses a high density of states near the Fermi level.

During set and reset, high electric fields can cause $O^{2-}$ ions to move towards the positively-biased electrode, changing the composition profile x(z) along the direction z across the switching region. In the OFF state, x(z) is strongly non-uniform and the current is limited by the very high resistance of the $MoO_3$ layer, whereas in the ON state, the material is conducting.

Figure 5A:
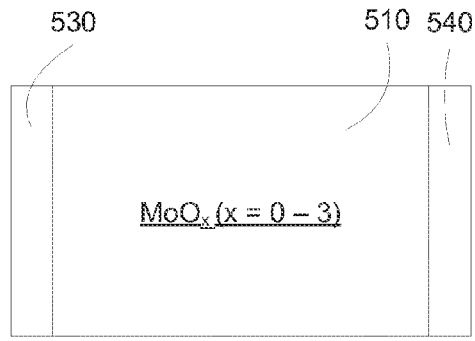
FIGS. 5A-5C illustrate possible mechanism for a $MoO_x$ switching element according to some embodiments.
Figure 5B:
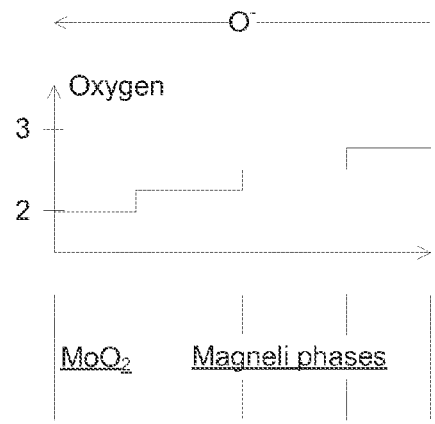
Figure 5B:
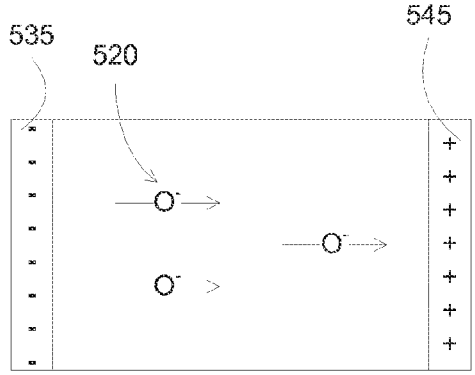
Figure 5C:
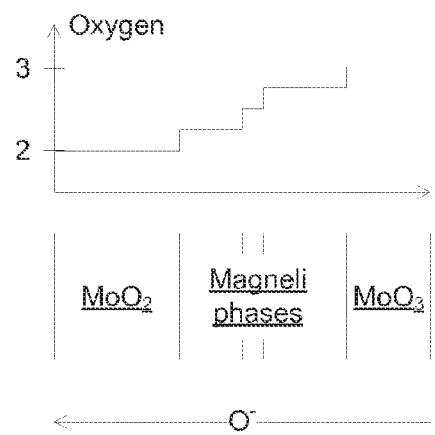

FIGS. 5A-5C illustrate possible mechanism for a $MoO_x$ switching element according to some embodiments. In FIG. 5A, a switching element 510 is shown, including molybdenum oxide $MoO_x$, with x between 2 and 3. In some embodiments, x can be between 0 and 3. The switching element 510 can form various Magnéli phases of molybdenum oxide. The switching element 510 can be positioned between two electrodes 530 and 540. In FIG. 5B, an electric field is imposed on the switching element 510, for example, by applying a voltage to the electrodes 530 and 540, such as applying a negative voltage 535 to the electrode 530 and a positive voltage 545 to the electrode 540. Under the influence of the electric field, the oxygen ions 520 in the switching element 510 can move, redistributing the Magnéli phases within the switching element 510.

In FIG. 5C, possible changes in the profile of a $MoO_x$ resistive switching layer is shown. Under the influence of an electric field, oxygen ions can migrate toward one side of the resistive switching layer, forming $MoO_2$ at the end and various Magnéli phases distributing to the rest of the resistive switching layer. Since $MoO_2$ is highly conducting, and Magnéli phases of $MoO_x$ are also conducting, e.g., poorly conducting as compared to $MoO_2$, a combination of these materials can convert the resistive switching layer to be poorly conducting, e.g., dominated by the conductivity of the Magnéli phases. An opposite electric field can be applied, driving the oxygen ions toward the opposite side of the resistive switching layer. Under proper conditions, e.g., having adequate oxygen ions at the opposite side, oxygens can be redistributed, for example, the Magnéli phases can be changed, the $MoO_2$ region can be enlarged, and a $MoO_3$ can be formed at the opposite side. Since $MoO_3$ is not conducting, a combination of these materials can convert the resistive switching layer to be insulating, e.g., dominated by the non-conducting property of the $MoO_3$. The cycle can be repeated, switching the resistive switching layer between two bistable states, a conducting state and an insulating state.

In some embodiments, switching layers in resistive random access memories and methods to form the switching layers are provided. The switching layer can include molybdenum oxide in which the atomic ratio of oxygen to molybdenum is between 2 and 3. For example, the chemical formula for molybdenum oxide can be MoOx, with x between 2 and 3. In some embodiments, the molybdenum oxide exists in Magnéli phases, such as $Mo_{13}O_{33}$, $Mo_4O_{11}$, $Mo_{17}O_{47}$, $Mo_8O_{23}$, or $Mo_9O_{26}$. In some embodiments, the switching layer can include molybdenum oxide in which the atomic ratio of oxygen to molybdenum is less than 3, e.g., between metallic molybdenum (ratio is 0) to molybdenum dioxide (ratio is 2) to molybdenum trioxide (ratio is 3).

Figure 6A:
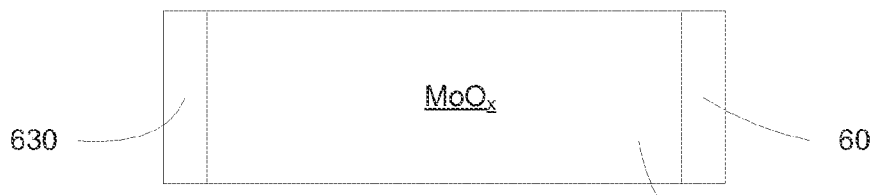
FIGS. 6A-6D illustrate an example of oxygen movement in a $MoO_x$ dielectric layer according to some embodiments.
Figure 6B:
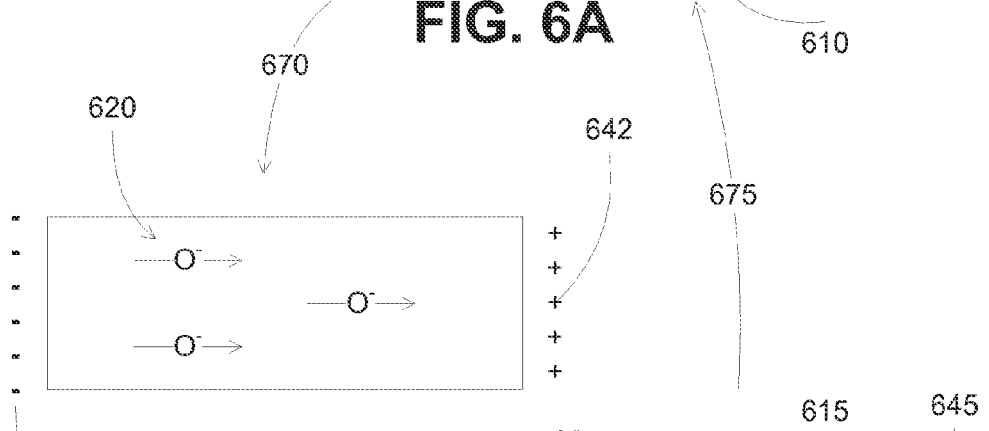
Figure 6C:
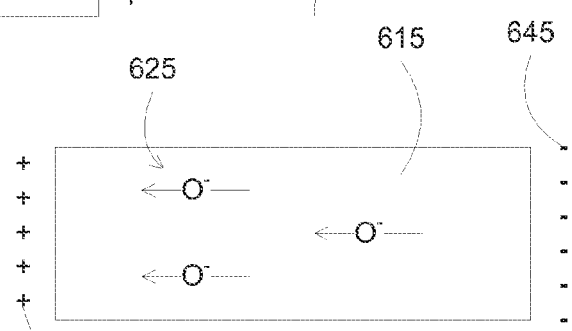
Figure 6D:
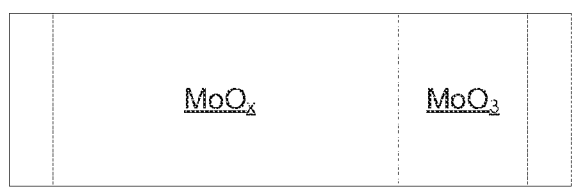

FIGS. 6A-6D illustrate an example of oxygen movement in a $MoO_x$ resistive switching layer according to some embodiments. In FIG. 6A, a resistive switching layer 610 can be sandwiched between two electrodes 630 and 640. During an operation 670 of the resistive random access memories, an electric field can be established across the resistive switching layer 610, for example, by applying a set or reset voltage. The electric field can cause movement of the oxygen charges, e.g., $O^{2-}$ ions, changing the composition profile of the resistive switching layer 610. For example, in FIG. 6B, a high electric field generated by a reset voltage, e.g., by applying a negative voltage 632 to the electrode 630 and a positive voltage 642 to the electrode 640, can cause $O^{2-}$ ions 620 to move toward the positive electrode, forming a layer of molybdenum trioxide ($MoO_3$) near the positive electrode (FIG. 6D). Since molybdenum trioxide is an insulator, the resistance of the switching layers can be reset to a higher value. In another operation 675 (FIG. 6C), a high electric field in the opposite direction, e.g., generated by a set voltage, e.g., by applying a positive voltage 635 to the electrode 630 and a negative voltage 645 to the electrode 640, can cause $O^{2-}$ ions 625 to move toward the negative electrode, converting the layer of molybdenum trioxide ($MoO_3$) near the positive electrode back to molybdenum oxide (FIG. 6A). Since molybdenum oxide is a conductor, resistance of the switching layers can be set to a low value.

Figure 7A:
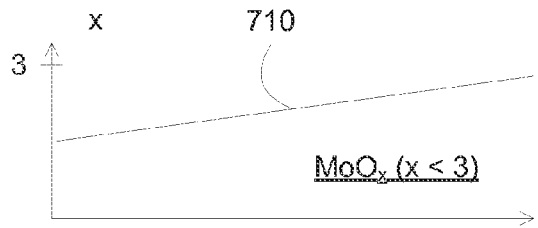
FIGS. 7A-7D illustrate an example of oxygen distribution in a $MoO_x$ dielectric layer according to some embodiments.
Figure 7B:
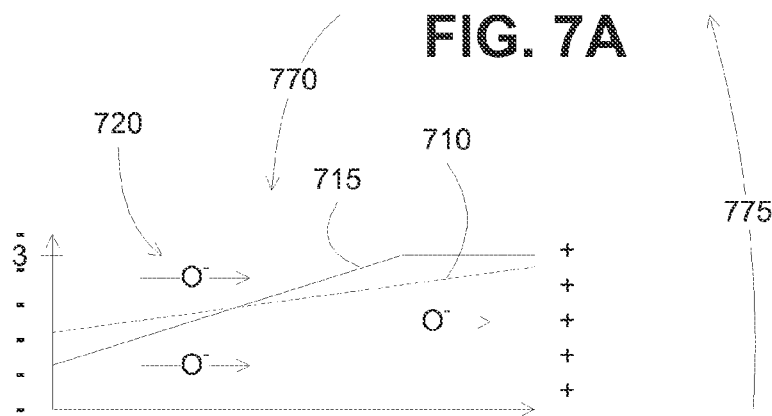
Figure 7C:
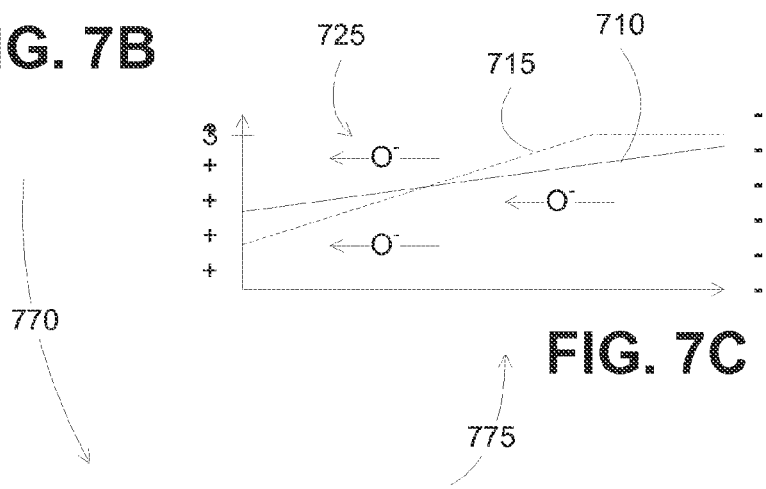
Figure 7D:
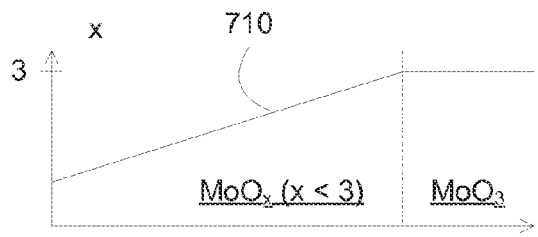

FIGS. 7A-7D illustrate an example of oxygen distribution in a $MoO_x$ switching resistive layer according to some embodiments. The horizontal axes represent the distance z along the switching region, from a first electrode on the left to the second electrode on the right. The vertical axes represent the oxygen to molybdenum ratio x. In FIG. 7A, a resistive switching layer can have an oxygen distribution 710. The oxygen amount can be configured to form $MoO_x$, e.g., having x less than 3. In FIG. 7B, during an operation 770, an electric field can be established across the dielectric layer, causing movement of the oxygen charges, e.g., $O^{2-}$ ions 720, changing the composition profile 710 to 715. Under proper condition, x can reach 3, forming a layer of molybdenum trioxide ($MoO_3$) near the positive electrode (FIG. 7D). In FIG. 7C, in another operation 775, a high electric field in the opposite direction can cause $O^{2-}$ ions 725 to move toward the negative electrode, changing the oxygen distribution 715 back to 710, e.g., converting the layer of molybdenum trioxide ($MoO_3$) near the positive electrode back to molybdenum oxide (FIG. 7A).

In some embodiments, the oxygen content in the molybdenum oxide resistive switching layer can be high, for example, x is almost 3, e.g., closer to molybdenum trioxide. The high content of oxygen can facilitate the formation of molybdenum trioxide during the reset operation. For example, the atomic ratio of oxygen and molybdenum can be greater than 2.5, or can be greater than 2.75.

Figure 8A:
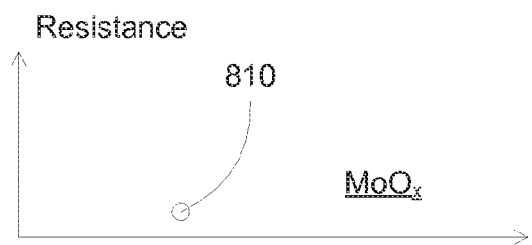
FIGS. 8A-8D illustrate an example of resistance changes in a $MoO_x$ dielectric layer according to some embodiments.
Figure 8B:
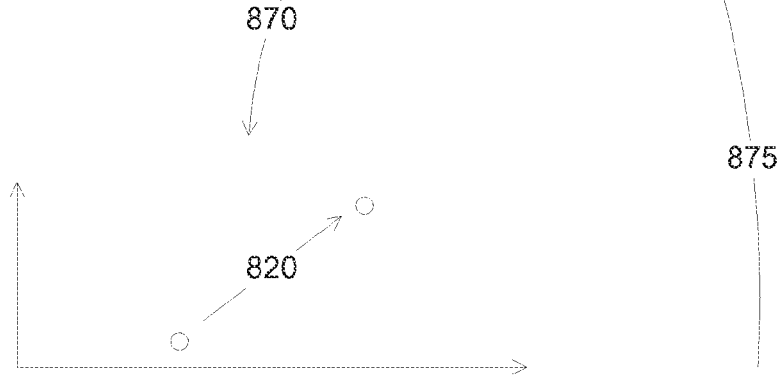
Figure 8C:
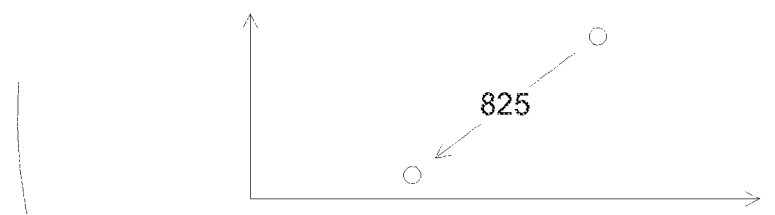
Figure 8D:
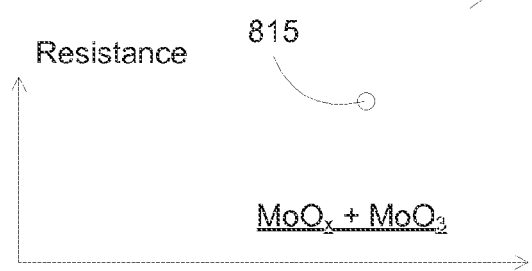

FIGS. 8A-8D illustrate an example of resistance changes in a $MoO_x$ resistive switching layer according to some embodiments. The horizontal axes represent different cases of oxygen distribution throughout the resistive switching layer, which for visual clarity are nominally represented as a set of possible states of oxygen distribution. In FIG. 8A, a resistive switching layer can be in a state containing different Magnéli phases of $MoO_x$ and can have a low resistance 810. In FIG. 8B, during an operation 870, an electric field can be established across the dielectric layer, causing movement of the oxygen charges, changing 820 the composition profile of the dielectric layer, and reset the resistance of the resistive switching layer to a higher value 815. In FIG. 8C, in another operation 875, a high electric field in the opposite direction can cause $O^{2-}$ ions to move in an opposite way, changing back 825 the composition profile of the dielectric layer, and set the resistance of the resistive switching layer to a low value 810.

The application of the operating voltages, e.g., reset voltage, might not require substantial heating of the switching region. Moreover, excessive heating could oppose the reset operation by entropically favoring a uniform profile. In some embodiments, this heating effect can be minimal for the following reasons. The switching region can be quite short and its dimensions may be comparable to the electron mean-free-path. The electron transport may to a large extent be ballistic, so that the Joule heat first becomes contained in the non-equilibrium electron distribution away from the Fermi-Dirac distribution. The heat can be dissipated into phonon modes away from the switching region, minimizing the heating of this region.

Different concentration profile of oxygen can be used for the $MoO_x$ switching dielectric layer. To facilitate the formation of $MoO_3$, the value of x in $MoO_x$ can be close to 3 at one end of the dielectric layer. In addition, to facilitate the formation of Mo or $MoO_2$, the value of x in $MoO_x$ can be close to 0 or 2, respectively, at an opposite end of the dielectric layer.

FIGS. 9A-9E illustrate different as-deposited concentration profiles of $MoO_x$ switching layers according to some embodiments. The horizontal axes represent the distance z along the switching region, from a first electrode on the left to the second electrode on the right. The vertical axes represent the oxygen to molybdenum ratio x. In some embodiments, the oxygen distribution profile in the molybdenum oxide switching layers can be graded, for example, to assist in forming molybdenum trioxide or molybdenum dioxide. The oxygen distribution profile can be linear, non-linear, or stepwise graded. During device operation, the switching region can include various molybdenum oxide phases, and the concentration profile can be substantially different from the one used during deposition. The set or reset voltage polarity can depend on the oxygen gradient. For example, a reset voltage can be provided with a positive polarity applied at the end of the switching layer with high oxygen content. Oxygen ions can migrate to the positive polarity, from the low oxygen region to the high oxygen region. Further addition of oxygen to the high oxygen region can facilitate the formation of molybdenum trioxide, resetting the switching layers to a high resistance value. A set voltage can be provided with a positive polarity applied at the end of the switching layer with low oxygen content. Oxygen ions can migrate to the positive polarity, from the high oxygen region to the low oxygen region. The movement of oxygen can convert molybdenum trioxide at the high oxygen region to molybdenum oxide, setting the switching layers to a low resistance value. Further, since the low oxygen region has low oxygen content, further addition of oxygen would not be sufficient to convert the molybdenum oxide at the low oxygen region to molybdenum trioxide.

Figure 9A:
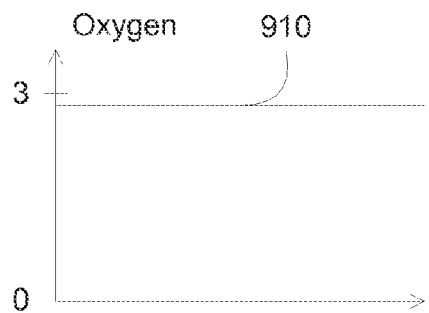
FIGS. 9A-9E illustrate different concentration profiles of $MoO_x$ switching dielectric layers according to some embodiments.
Figure 9B:
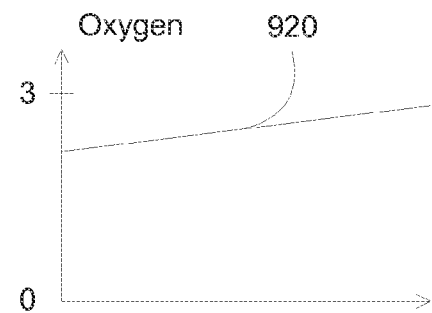
Figure 9C:
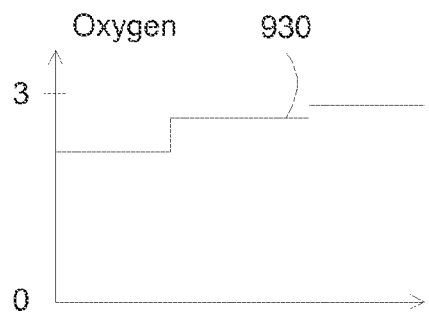
Figure 9D:
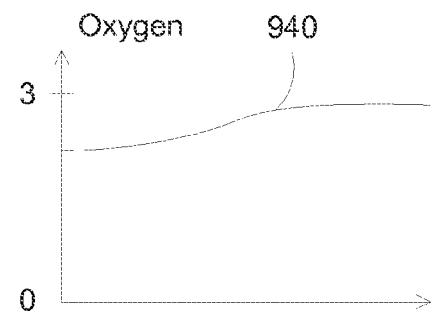
Figure 9E:
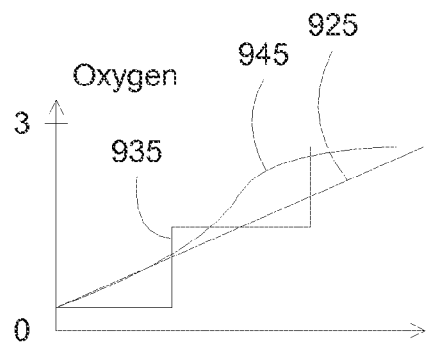

In FIG. 9A, a constant profile 910 can be used during deposition. The constant value of x in $MoO_x$ can be near 3, such as greater than 2.5, greater than 2.75 or greater than 2.9 (and smaller than 3). In FIG. 9B, a linear profile 920 can be used during deposition. At one end of the dielectric layer, the value of x can be close (and smaller) to 3, such as greater than 2.5, greater than 2.75 or greater than 2.9. At an opposite end, the value of can be close (and greater than) to 2, such as smaller than 2.5, smaller than 2.25 or smaller than 2.1 (and greater than 2). In FIG. 9C, a stepwise profile 930 can be used during deposition. At one end of the dielectric layer, the value of x can be close (and smaller) to 3, such as greater than 2.5, greater than 2.75 or greater than 2.9. At an opposite end, the value of can be close (and greater than) to 2, such as smaller than 2.5, smaller than 2.25 or smaller than 2.1 (and greater than 2). In FIG. 9D, a curve profile 940 can be used during deposition. At one end of the dielectric layer, the value of x can be close (and smaller) to 3, such as greater than 2.5, greater than 2.75 or greater than 2.9. At an opposite end, the value of can be close (and greater than) to 2, such as smaller than 2.5, smaller than 2.25 or smaller than 2.1 (and greater than 2). In FIG. 9E, the profiles used during deposition can be close to 0 at the opposite end, e.g., to form Mo instead of $MoO_2$. A linear profile 925, a stepwise profile 935, or a curve profile 945 can be used. Other profiles can also be used, such as a combination of linear and curve profiles. All such profiles can have a monotonously increasing (or, by interchanging the two electrodes, monotonously decreasing) concentration profiles, meaning that there is no lowering (respectively no increase) in the oxygen to molybdenum ratio along a path connecting the two electrodes.

In some embodiments, the above profiles can be formed during deposition. A desired profile can be achieved after the memory device is subjected to a forming operation, e.g., by applying a forming voltage. In some embodiments, the forming operation can generated a stepwise profile related to different Magnéli phases of $MoO_x$ from a deposited profile. For example, during deposition, the precursor for molybdenum oxide layer can be deposited as a sequence of Mo and $MoO_x$ with x approaching 3. Subsequently, Mo is oxidized to form $MoO_2$. There can be some unoxidized Mo, which is acceptable and would act as a part of an electrode. Alternatively, a nearly uniform layer with 2<x<3 can be deposited, and the gradient is created during the subsequent forming. Different intial profiles can require different forming processes, with an initial profile closer to a final profile can requiring smaller forming voltage.

Alternatively, a different operation mechanism can be used for switching involving Mo and Mo-oxide phases. The dielectric layer can be formed as an entirely conducting $Mo/MoO_2$ filament in the ON state and $MoO_3$ and/or $MoO_3$/Magnéli phase spacer in the OFF state. In some embodiments, this mode of operation can be avoided as it can require excessive power dissipation during some operations, such as during a reset operation.

For example, a high electric field generated by a set voltage can cause $O^{2-}$ ions to move away from the negative electrode, forming a layer of molybdenum dioxide ($MoO_2$) near the negative electrode. Since molybdenum dioxide has higher conductivity than molybdenum oxide $MoO_x$ with 2<x<3, the resistance of the switching layers can be set to a lower value. A high electric field in the opposite direction, e.g., generated by a reset voltage can cause $O^{2-}$ ions to move toward the positive electrode, converting the layer of molybdenum dioxide ($MoO_2$) near the negative electrode back to molybdenum oxide $MoO_x$. Since molybdenum oxide $MoO_x$ has higher resistance than molybdenum dioxide, resistance of the switching layers can be reset to a high value.

FIGS. 10A-10D illustrate an example of oxygen movement in a $MoO_x$ dielectric layer according to some embodiments. In FIG. 10A, a dielectric layer 1010 can be sandwiched between two electrodes 1030 and 1040. During an operation 1070 of the resistive random access memories, an electric field can be established across the dielectric layer 1010, for example, by applying a set or reset voltage. The electric field can cause movement of the oxygen charges, e.g., $O^{2-}$ ions, changing the composition profile of the dielectric layer 1010. For example, in FIG. 10B, a high electric field generated by applying a negative voltage 1032 to the electrode 1030 and a positive voltage 1042 to the electrode 1040, can cause $O^{2-}$ ions 1020 to move toward the positive electrode, depleting oxygen to form a layer of molybdenum or molybdenum dioxide ($MoO_2$) near the negative electrode (FIG. 10D). Since molybdenum or molybdenum dioxide is an excellent conductor, the resistance of the switching layers can be changed to a lower value. In another operation 1075 (FIG. 10C), a high electric field in the opposite direction, e.g., generated by applying a positive voltage 1035 to the electrode 1030 and a negative voltage 1045 to the electrode 1040, can cause $O^{2-}$ ions 1025 to move toward the negative electrode, converting the layer of molybdenum or molybdenum dioxide ($MoO_2$) near the negative electrode back to molybdenum oxide (FIG. 10A). Since molybdenum oxide is a poor conductor, resistance of the switching layers can be changed to a higher value.

Figure 11A:
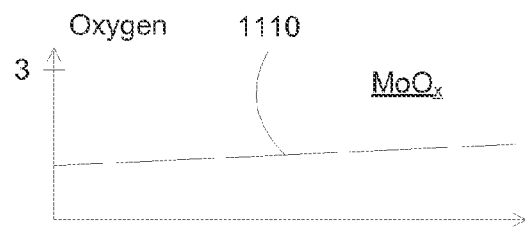
FIGS. 11A-11D illustrate an example of oxygen distribution in a $MoO_x$ dielectric layer according to some embodiments.
Figure 11B:
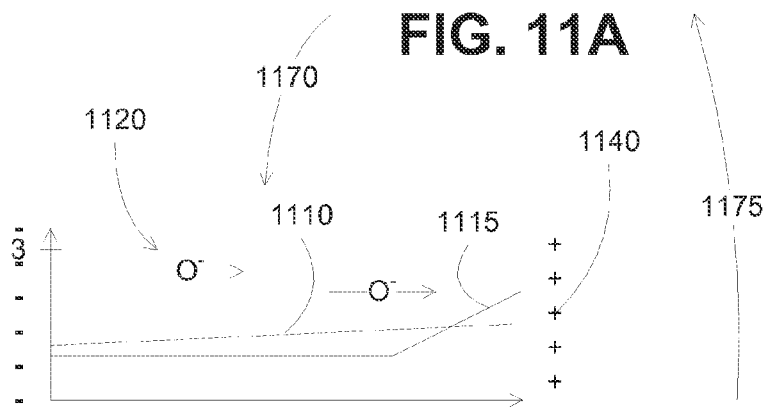
Figure 11C:
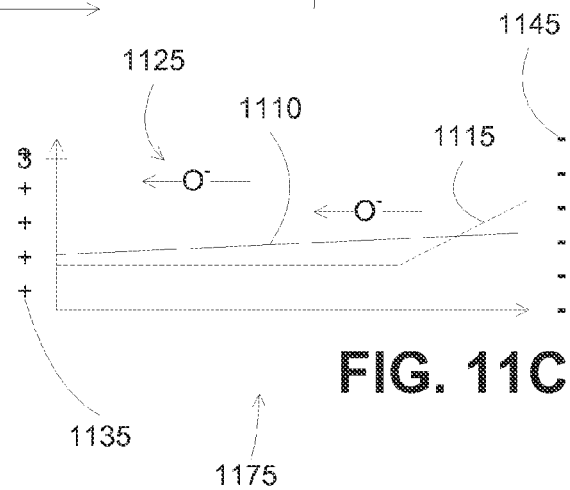
Figure 11D:
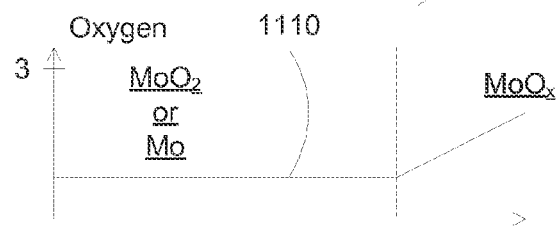

FIGS. 11A-11D illustrate an example of oxygen distribution in a $MoO_x$ dielectric layer according to some embodiments. In FIG. 11A, a dielectric layer can have an oxygen distribution 1110. The oxygen amount can be configured to form $MoO_x$, e.g., having x less than 3. In FIG. 11B, during an operation 1170, an electric field can be established across the dielectric layer, causing movement of the oxygen charges, e.g., $O^{2-}$ ions 1120, changing the composition profile 1110 to 1115. Under proper condition, x can reach 0 or 2, forming a layer of molybdenum or molybdenum dioxide ($MoO_2$) near the negative electrode (FIG. 11D). In FIG. 11C, in another operation 1175, a high electric field in the opposite direction can cause $O^{2-}$ ions 1125 to move toward the positive electrode, changing the oxygen distribution 1115 back to 1110, e.g., converting the layer of molybdenum or molybdenum dioxide ($MoO_2$) back to molybdenum oxide (FIG. 11A).

Figure 12A:
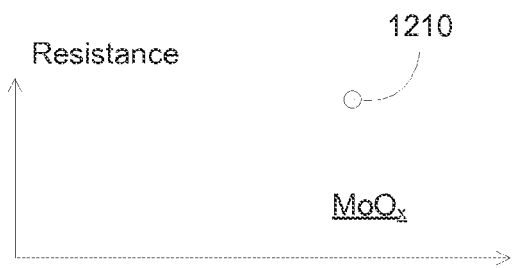
FIGS. 12A-12D illustrate an example of resistance changes in a $MoO_x$ dielectric layer according to some embodiments.
Figure 12B:
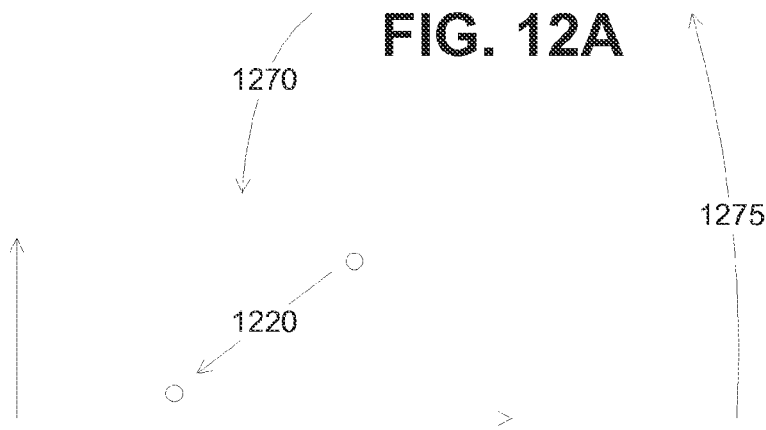
Figure 12C:
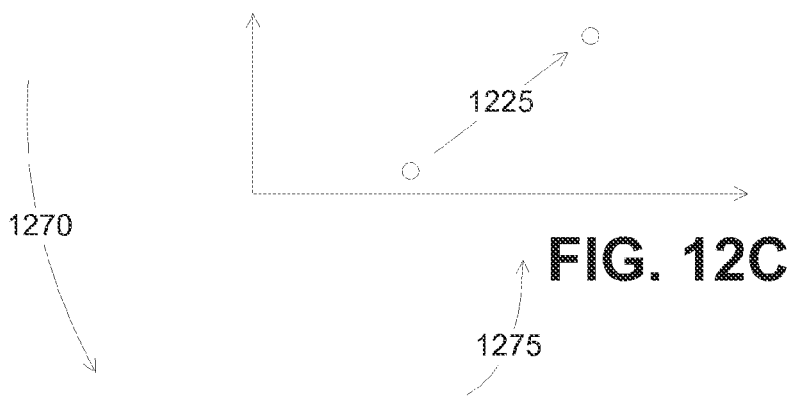
Figure 12D:
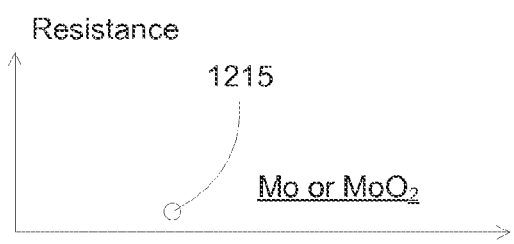

FIGS. 12A-12D illustrate an example of resistance changes in a $MoO_x$ dielectric layer according to some embodiments. In FIG. 12A, a dielectric layer containing different Magnéli phases of $MoO_x$ can have a high resistance 1210. In FIG. 12B, during an operation 1270, an electric field can be established across the dielectric layer, causing movement of the oxygen charges, changing 1220 the composition profile of the dielectric layer, and change the resistance of the dielectric layer to a lower value 1215. In FIG. 12C, in another operation 1275, a high electric field in the opposite direction can cause $O^{2-}$ ions to move in an opposite way, changing back 1225 the composition profile of the dielectric layer, and change the resistance of the dielectric layer to a high value 1210.

In some embodiments, the switching layer can include a bi-layer of a first region of molybdenum trioxide and a second region of molybdenum oxide with the atomic ratio of oxygen to molybdenum in the molybdenum oxide less than 3. The molybdenum trioxide region can relax the requirement for reset operation, since molybdenum trioxide has been already formed. A set voltage can be provided with a negative polarity applied at the molybdenum trioxide region side of the switching layer, and the positive polarity at the opposite side of the switching layer. Oxygen ions can migrate to the positive polarity, from the molybdenum trioxide region to the molybdenum oxide region. The movement of oxygen can convert molybdenum trioxide to molybdenum oxide, setting the switching layers to a low resistance value. In some embodiments, operation of the $MoO_x/MoO_3$ bilayer can be similar to a single layer of $MoO_x$ described above. An applied voltage can convert $MoO_3$ to $MoO_x$, and an opposite voltage can return the $MoO_x$ to $MoO_3$.

Figure 13A:
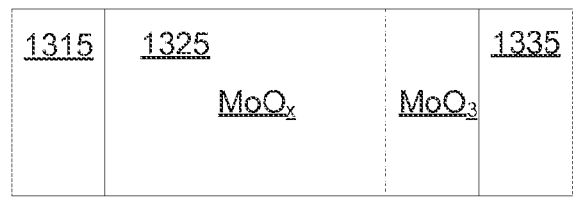
FIGS. 13A-13E illustrate bilayer $MoO_x$ switching dielectric layers according to some embodiments.
Figure 13B:
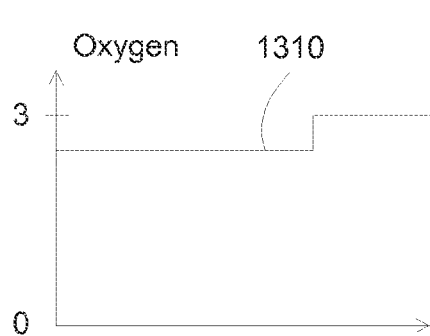
Figure 13C:
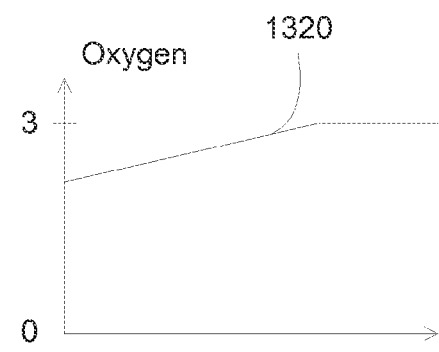
Figure 13D:
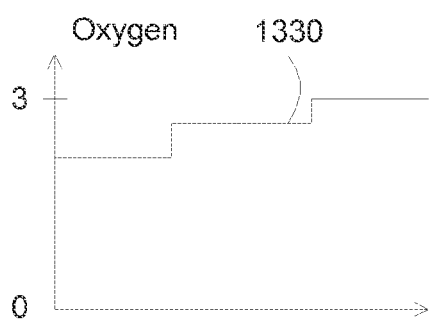
Figure 13E:
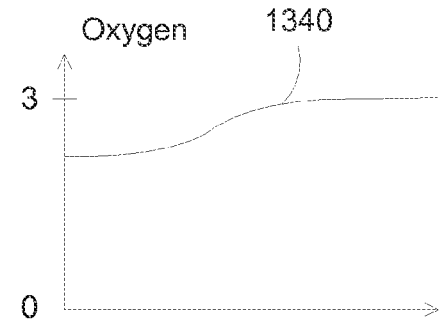

FIGS. 13A-13E illustrate bilayer $MoO_x$ switching dielectric layers according to some embodiments. In FIG. 13A, a dielectric layer 1325 is sandwiched between two electrode 1315 and 1335. The dielectric layer 1325 can include a layer of $MoO_x$ on a layer of $MoO_3$. FIGS. 13B-13E shows different oxygen profiles of the dielectric layer 1325, including a constant x=3 profile for the layer of $MoO_3$, and a constant profile 1310, a linear profile 1320, a stepwise linear 1330, and a curve profile 1340 for the $MoO_x$ layer. The profiles shown can be as deposited profiles, which can be changed after a forming operation.

In some embodiments, the switching layer can include a bi-layer of a first region of molybdenum or molybdenum dioxide and a second region of molybdenum oxide with the atomic ratio of oxygen to molybdenum in the molybdenum oxide between 2 and 3. The molybdenum or molybdenum dioxide can prevent the formation of molybdenum trioxide during the set operation, in which the oxygen ions migrate toward the molybdenum or molybdenum dioxide. For example, a set voltage can be provided with a positive polarity applied at the molybdenum or molybdenum dioxide region of the switching layer. Oxygen ions can migrate to the positive polarity, from the molybdenum oxide region to the molybdenum or molybdenum dioxide region. The movement of oxygen can convert molybdenum trioxide, if any, for example formed during the reset operation, at the molybdenum oxide region to molybdenum oxide, setting the switching layers to a low resistance value. Further, since the molybdenum or molybdenum dioxide region has low oxygen content, further addition of oxygen would not be equate to convert the molybdenum oxide at the molybdenum or molybdenum dioxide region to molybdenum trioxide.

Figure 14A:
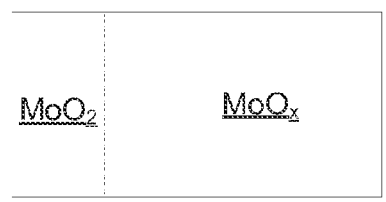
FIGS. 14A-14E illustrate bilayer $MoO_x$ switching dielectric layers according to some embodiments.
Figure 14B:
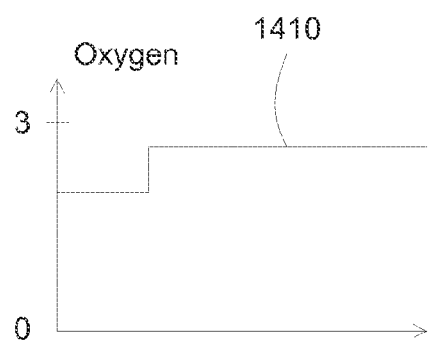
Figure 14C:
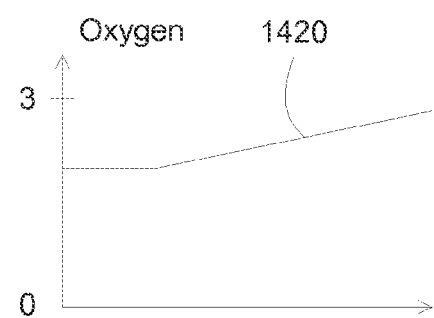
Figure 14D:
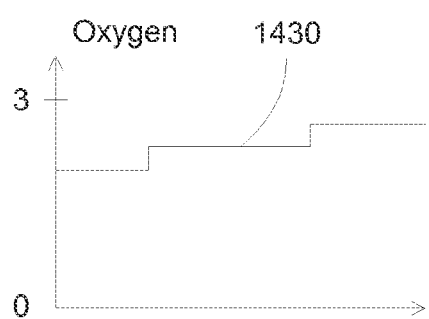
Figure 14E:
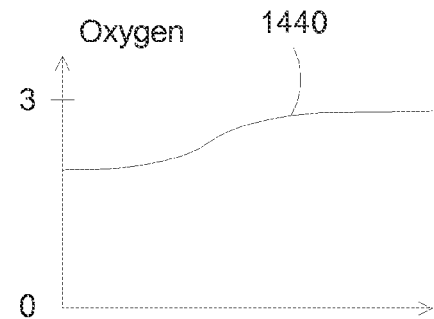

FIGS. 14A-14E illustrate bilayer $MoO_x$ switching dielectric layers according to some embodiments. In FIG. 14A, a dielectric layer 1425 is sandwiched between two electrode 1415 and 1435. The dielectric layer 1425 can include a layer of $MoO_x$ and a layer of $MoO_2$. FIGS. 14B-14E show different oxygen profiles of the dielectric layer 1425, including a constant x=2 profile for the layer of $MoO_2$, and a constant profile 1410, a linear profile 1420, a stepwise linear 1430, and a curve profile 1440 for the $MoO_x$ layer. The profiles shown can be as deposited profiles, which can be changed after a forming operation.

Figure 15A:
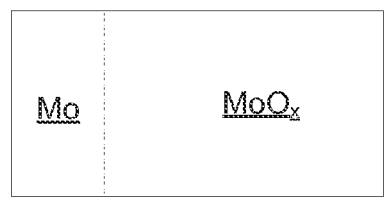
FIGS. 15A-15E illustrate bilayer $MoO_x$ switching dielectric layers according to some embodiments.
Figure 15B:
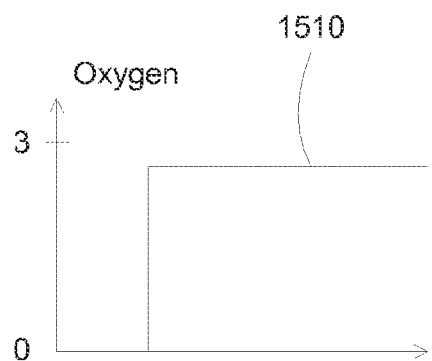
Figure 15C:
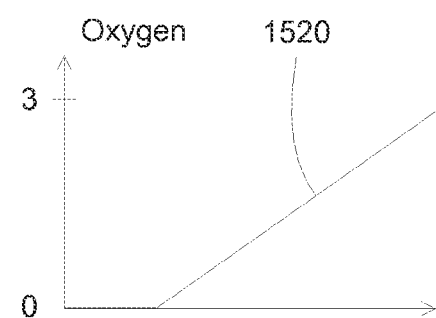
Figure 15D:
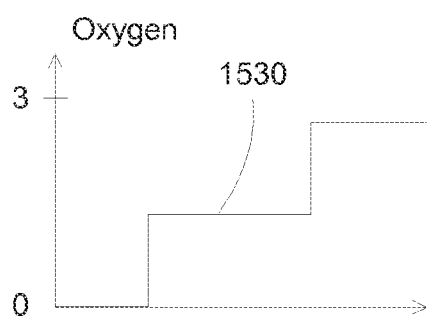
Figure 15E:
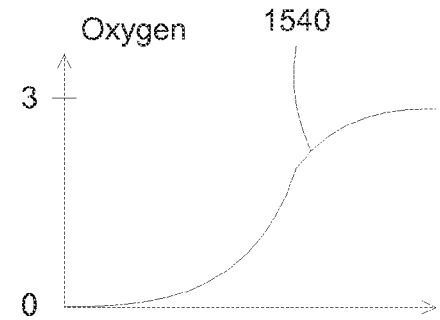

FIGS. 15A-15E illustrate bilayer $MoO_x$ switching dielectric layers according to some embodiments. In FIG. 15A, a dielectric layer 1525 is sandwiched between two electrode 1515 and 1535. The dielectric layer 1525 can include a layer of $MoO_x$ and a layer of Mo. FIGS. 15B-15E shows different oxygen profiles of the dielectric layer 1525, including a constant x=0 profile for the layer of Mo, and a constant profile 1510, a linear profile 1520, a stepwise linear 1530, and a curve profile 1540 for the $MoO_x$ layer. The profiles shown can be as deposited profiles, which can be changed after a forming operation.

In some embodiments, the switching layer can include a tri-layer of a first region of molybdenum or molybdenum dioxide, a second region of molybdenum oxide with the atomic ratio of oxygen to molybdenum in the molybdenum oxide between 2 and 3, and a third region of molybdenum trioxide.

Figure 16A:
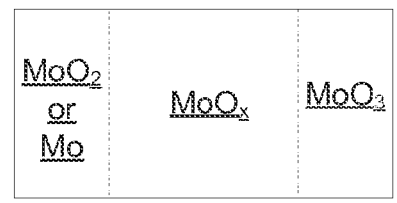
FIGS. 16A-16E illustrate trilayer $MoO_x$ switching dielectric layers according to some embodiments.
Figure 16B:
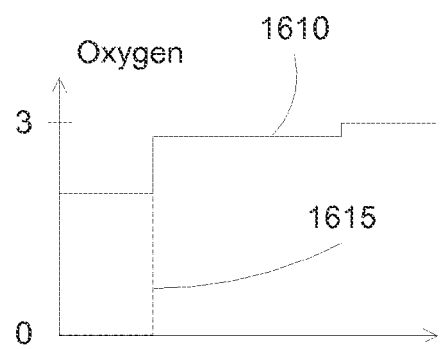
Figure 16C:
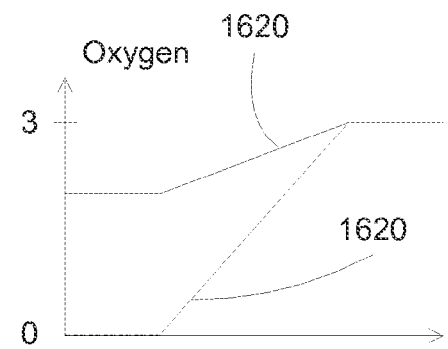
Figure 16D:
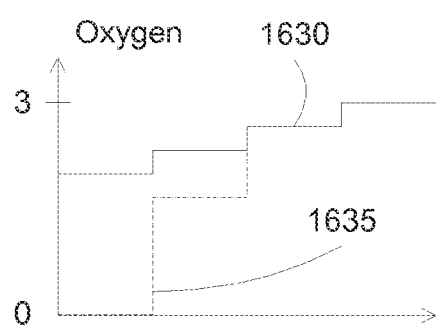
Figure 16E:
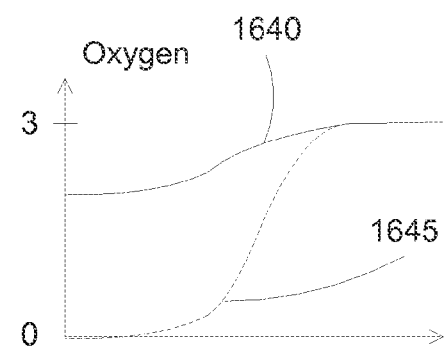

FIGS. 16A-16E illustrate trilayer $MoO_x$ switching dielectric layers according to some embodiments. In FIG. 16A, a dielectric layer 1625 is sandwiched between two electrode 1615 and 1635. The dielectric layer 1625 can include a layer of Mo or $MoO_2$, a layer of $MoO_x$ and a layer of $MoO_3$. FIGS. 16B-16E shows different oxygen profiles of the dielectric layer 1625, including a constant x=0 or x=2 profile for the layer of Mo or $MoO_2$, respectively, a constant x=3 profile for the layer of $MoO_3$, and a constant profile 1610/1615, a linear profile 1620/1625, a stepwise linear 1630/1635, and a curve profile 1640/1645 for the $MoO_x$ layer. The profiles shown can be as deposited profiles, which can be changed after a forming operation.

In some embodiments, the concentration profile can change in the direction along the electrode surface. In some embodiments, such concentration variation can be introduced during deposition and/or annealing. In some embodiments, such concentration variation can develop during device operation, and can be related to an appearance of one or several preferred conduction paths, that can be called conducting filaments. In some embodiments, the profiles in the foregoing figures can illustrate the variation of concentration along the preferred conduction path. In some embodiments, the foregoing discussion of composition profiles in the resistive switching layer may apply specifically to the region along the preferred conduction path, and may or may not apply to the regions away from the preferred conduction path.

In practice, due to electrospacial instability, a layer of $MoO_3$ might not be destroyed entirely during the application of SET voltage, but rather a "filament" of conducting Mangeli phases (and/or $MoO_2$) can be formed. The above illustrations thus focus on the profile of oxygen along the filament, e.g., along the principal current path. Further, in the above-described mode, RESET currents would be limited by the high resistivity of the Magnéli phases, and the high electric fields would be created in the relatively short high-resistivity region, where switching needs to occur.

Figure 17A:
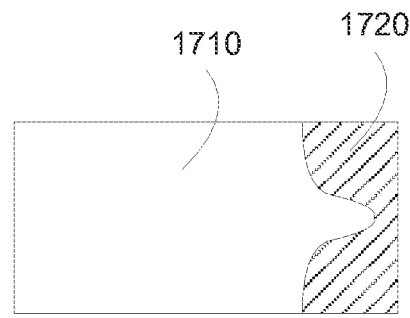
FIG. 17A-17B illustrate a filament mechanism in a dielectric layer according to some embodiments.
Figure 17B:
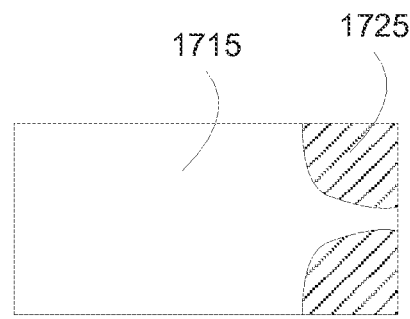

FIG. 17A-17B illustrate a filament mechanism in a resistive switching layer according to some embodiments. A filament can be formed, separating $MoO_x$ region 1710 and $MoO_3$ region 1720, switching to high resistance state in FIG. 17A. In FIG. 17B, the filament can be extended to the electrode, separating the $MoO_3$ region 1725 with a $MoO_x$ region 1715, which is connected to the two electrodes.

In some embodiments, the memory device including a memory element can be used in a memory array, such as a cross point array. For example, the memory element can form a columnar memory device, which can be placed at the cross points of the word lines and bit lines.

Figure 18:
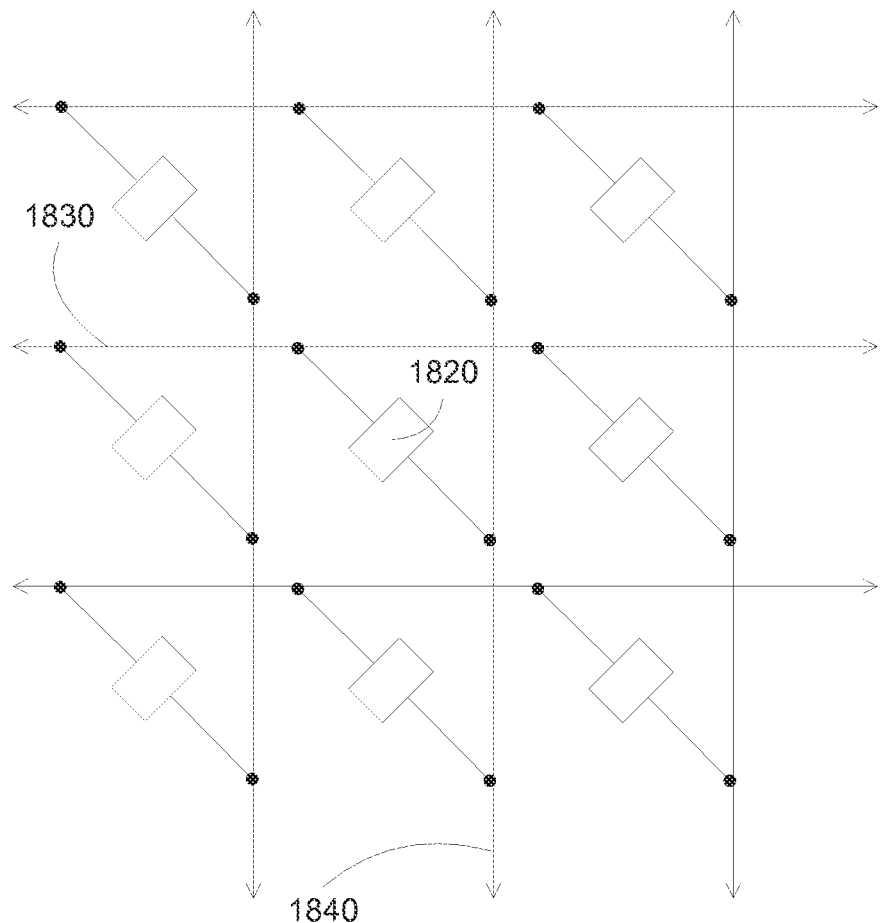
FIG. 18 illustrates a cross point memory array according to some embodiments.

FIG. 18 illustrates a cross point memory array according to some embodiments. A switching memory device can include a memory element 1820, which is both disposed between the electrodes 1830 and 1840. The memory element 1820 can include two or more dipole layers, and different work function electrodes that are configured to provide a built in electric field as discussed above.

In some embodiments, the memory device including a memory element and a current selector can be used in a memory array, such as a cross point array. For example, the current selector can be fabricated on the memory element, forming a columnar memory device, which can be placed at the cross points of the word lines and bit lines.

Figure 19:
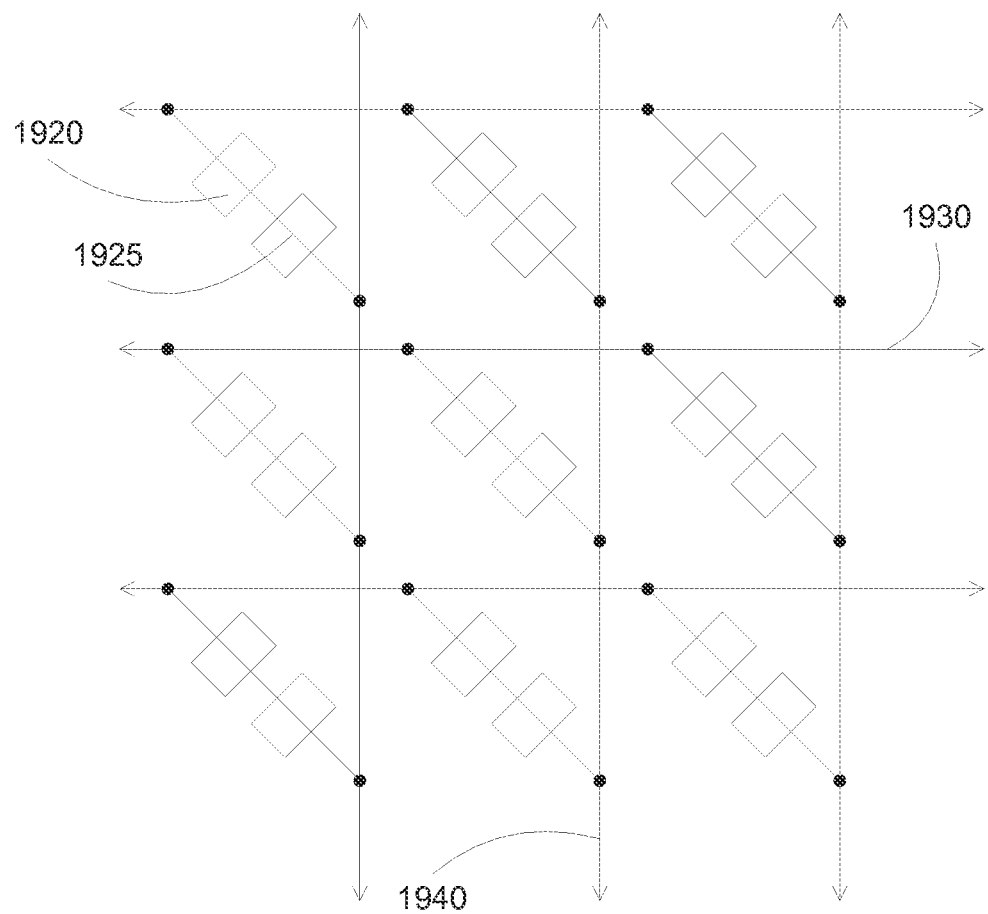
FIG. 19 illustrates a cross point memory array according to some embodiments.

FIG. 19 illustrates a cross point memory array according to some embodiments. A switching memory device can include a memory element 1920 and a current selector 1925, which are both disposed between the electrodes 1930 and 1940. The current selector can include a diode, which can function to reduce or eliminate leakage currents in the memory array. The current selector 1925 can be an intervening electrical component, disposed between electrode 1930 and memory element 1920, or between the electrode 1940 and memory element 1920.

Figure 20:
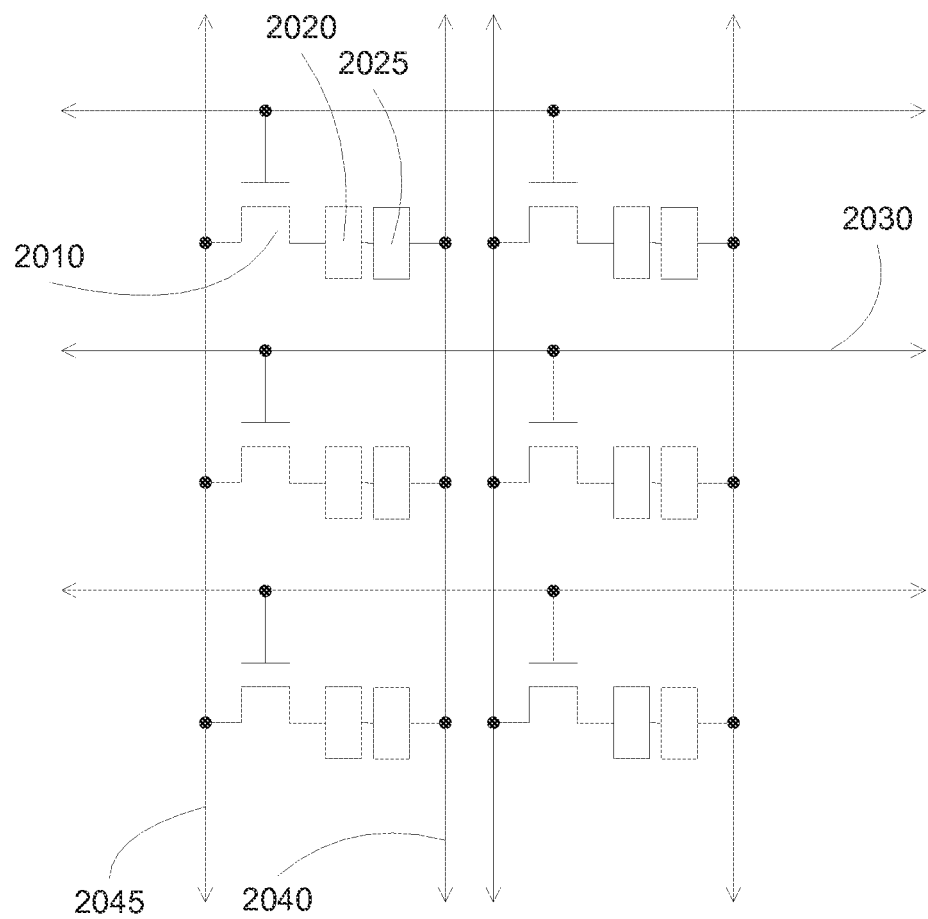
FIG. 20 illustrates a cross point memory array according to some embodiments.

FIG. 20 illustrates a cross point memory array according to some embodiments. A switching memory device can include a memory element 2020 and a current selector 2025, which are both disposed between the electrodes 2040 and 2045. Another selector device, such as a transistor 2010, can be used to isolate the memory devices, for example, through the control lines 2030.

Figure 21:
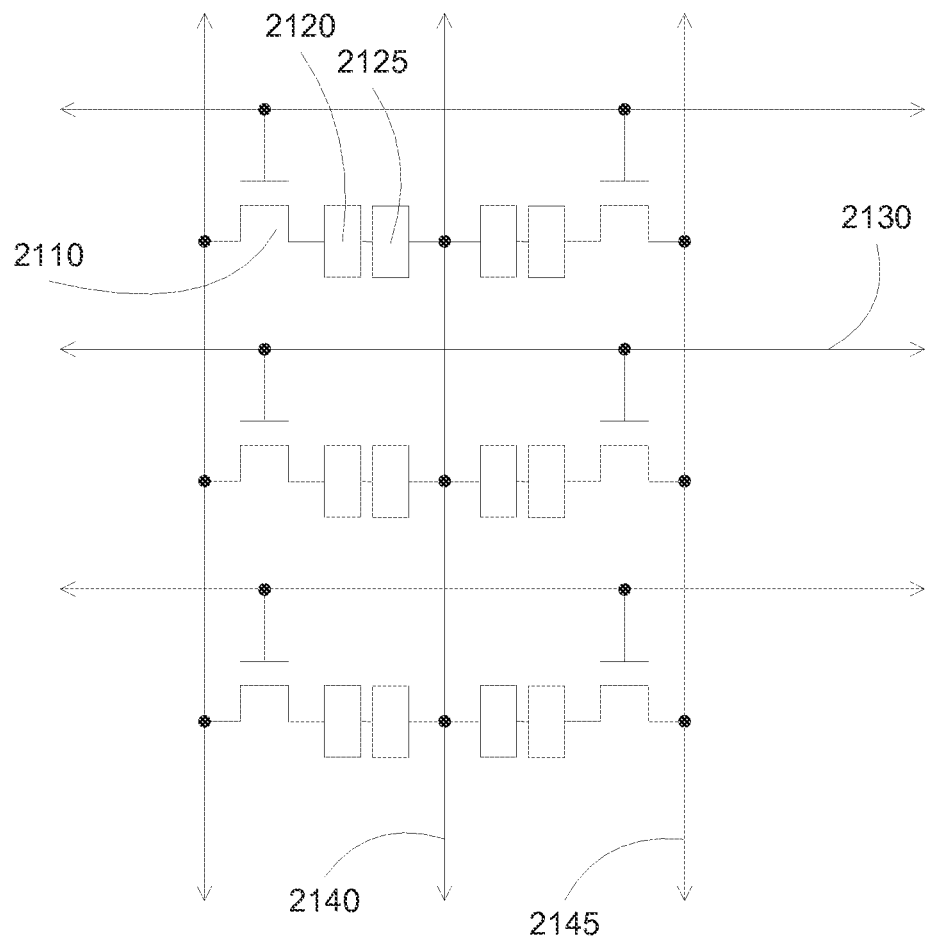
FIG. 21 illustrates another cross point memory array according to some embodiments.

FIG. 21 illustrates another cross point memory array according to some embodiments. The memory devices can be connected back to back, sharing electrodes 2140 and 2145. Control lines 2130 can be used to turn on transistor 2110, to select memory element 2120 and current selector 2125.

In some embodiments, methods to form memory devices can be provided. The methods can include depositing a first electrode, and a resistive switching layer having $MoO_x$ distributed through the resistive switching layer, together with optionally performing treatments after each layer. A second electrode can also be formed, sandwiching the resistive switching layer between the two electrodes. The electrodes can include materials having the same or different work functions. The treatment can include rapid thermal annealing or plasma treatment in oxidation or reduced ambient, such as a rapid thermal anneal in temperatures between 200 and 400 C., plasma oxygen anneal, and/or in-situ annealing after deposition.

Figure 22:
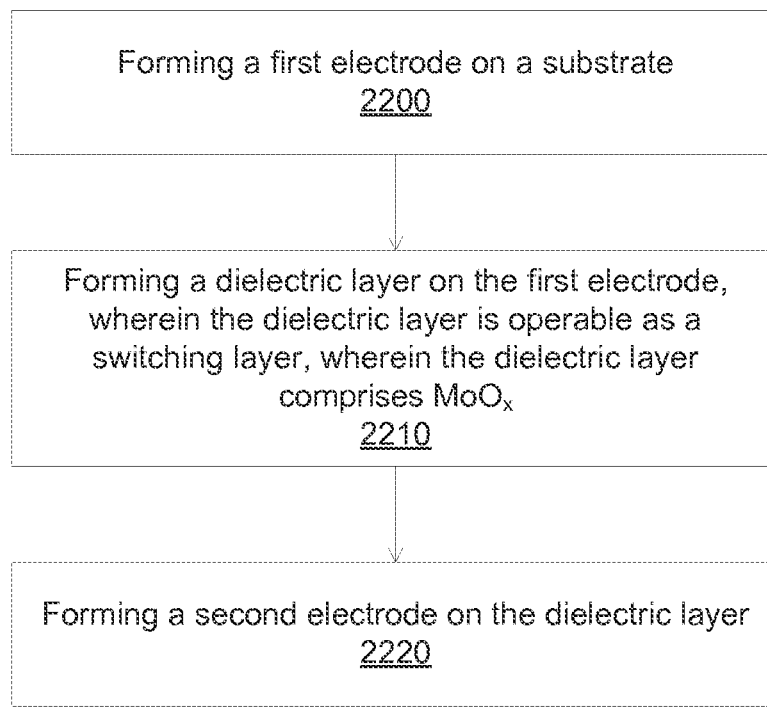
FIG. 22 illustrates a flowchart for forming a memory element according to some embodiments.

FIG. 22 illustrates a flowchart for forming a memory element according to some embodiments. The described flowchart is a general description of techniques used to form the memory element described above. The flowchart describes techniques for forming a memory element generally including two electrodes and one or more dielectric layers disposed therebetween. The dielectric layers can include a distribution of molybdenum or molybdenum oxide, including $MoO_2$, $MoO_x$ and $MoO_3$. Although certain processing techniques and specifications are described, it is understood that various other techniques and modifications of the techniques described herein may also be used.

In operation 2200, a first electrode layer is formed. The first electrode layer can be formed on a substrate, for example, a silicon substrate that may include one or more layers already formed thereon. In some embodiments, the first layer can be a polysilicon layer or a metal containing layer. For example, the first layer can be a highly doped polysilicon layer that is formed using a conventional chemical vapor deposition (CVD) or atomic layer deposition (ALD) type polysilicon deposition technique. In some cases, an optional native oxide layer removal step may be performed after forming the first layer by use of a wet chemical processing technique, or conventional dry clean process that is performed in a plasma processing chamber. It should be noted that the first layer may be provided on a substrate that may have other devices, such as a current selector device, and the electrode formed thereon as well. Alternatively, in the case where no other device is provided, the first layer can be the bottom electrode. The first electrode layer can include TiN, TaN, Ni, Pt, or Ru. Other elements can also be used, such as Ti, Al, $MoO_2$, W, poly-Si, TiSiN, TaSiN, or any combination, mixture or alloy thereof that can be formed using PVD or other processes. For example, the first electrode can be sputtered by bombarding a metal target at 150-500 W with a pressure of 2-10 mTorr for a deposition rate of approximately 0.5-5 Å/s. These specifications are given as examples, the specifications can vary greatly depending on the material to be deposited, the tool used to deposit the material, and the desired speed of deposition. The duration of the bombardment can determine the thickness of the electrode. Other processing techniques, such as ALD, pulsed layer deposition (PLD), CVD, evaporation, etc. can also be used to deposit the first electrode. In some embodiments, the first electrode is in contact with one of the signal lines. The first electrode may have any thickness, for example between about 5 nm and about 500 nm thick.

In operation 2210, a dielectric layer can be formed on the first electrode. The dielectric layer can be operable as a switching layer. The dielectric layer can include molybdenum or molybdenum oxide, including $MoO_2$, $MoO_x$ and $MoO_3$. The thickness of the dielectric layer can be between 2 nm and 100 nm. An optional treatment can be performed after depositing the dielectric layer. The treatment can include a plasma treatment or a high temperature treatment in an oxidizing or reducing ambient. For example, the treatment can include a rapid thermal oxidation at 300 C. in oxygen ambient. The treatment can be performed in-situ after the deposition of the first electrode layer. The treatment can include an oxygen radical anneal, e.g., plasma anneal in an oxygen ambient.

In some embodiments, the dielectric layer can be deposited by a PVD or ALD process. For example, an ALD process can include $O_3$ oxidant, at about 250-300 C. deposition temperature, using a molybdenum precursor.

In operation 2220, a second electrode layer is formed on the dielectric layer. The first electrode layer can include TiN, TaN, Ni, Pt, or Ru. Other elements can also be used, such as Ti, Al, $MoO_2$, W, poly-Si, TiSiN, TaSiN, or any combination, mixture or alloy thereof that can be formed using PVD or other processes. The second electrode can have any thickness, for example between about 5 nm and about 500 nm thick.

In some embodiments, the dielectric layer can include molybdenum oxide, wherein the atomic ratio of oxygen to molybdenum is between 2 and 3. The atomic ratio of oxygen to molybdenum can be substantially constant within the second layer. The atomic ratio of oxygen to molybdenum can be greater than 2.5. The atomic ratio of oxygen to molybdenum can be gradually graded in the second layer. The atomic ratio of oxygen to molybdenum can be stepwise graded in the second layer. The dielectric layer can have different profile of atomic ratio of oxygen to molybdenum, including constant profile, linear profile, stepwise profile, curve profile, or any combination thereof.

In some embodiments, the dielectric layer can include a bilayer of molybdenum oxide, with a first layer of molybdenum oxide having an atomic ratio between 2 and 3, and a second layer of molybdenum oxide having an atomic ratio less than 2. In some embodiments, the dielectric layer can include a bilayer of molybdenum oxide/molybdenum, with a first layer having molybdenum oxide having an atomic ratio between 2 and 3, and a second layer of molybdenum. In some embodiments, the dielectric layer can include a bilayer of molybdenum oxide, with a first layer of molybdenum oxide having an atomic ratio between 2 and 3, and a second layer of molybdenum oxide having an atomic ratio of 3, e.g., molybdenum trioxide ($MoO_3$).

In some embodiments, the dielectric layer can include a trilayer of molybdenum oxide/molybdenum, with a first layer of molybdenum, a second layer of molybdenum oxide having an atomic ratio between 2 and 3, and a third layer of molybdenum oxide having an atomic ratio of 3, e.g., molybdenum trioxide ($MoO_3$).

Figure 23:
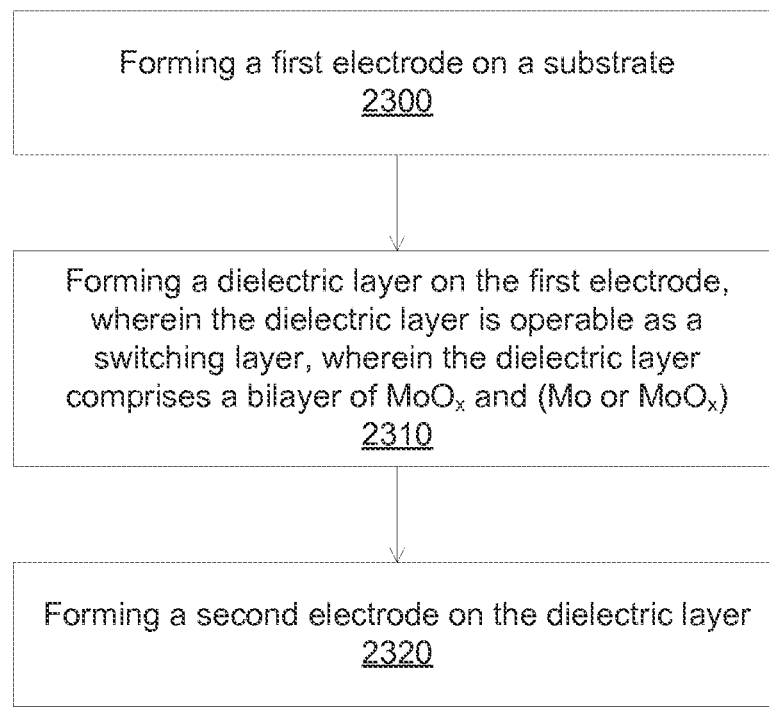
FIG. 23 illustrates a flowchart for forming a memory element according to some embodiments.

FIG. 23 illustrates a flowchart for forming a memory element according to some embodiments. The flowchart describes techniques for forming a memory element generally including two electrodes and one or more dielectric layers disposed therebetween. The dielectric layers can include one or more charge layers within the dielectric layer to generate internal electric field.

In operation 2300, a first electrode layer is formed. The first electrode layer can be formed on a substrate, for example, a silicon substrate that may include one or more layers already formed thereon. In operation 2310, a dielectric layer can be formed on the first electrode. The dielectric layer can be operable as a switching layer. The dielectric layer can include a bilayer of $MoO_x$, Mo, $MoO_2$ and $MoO_3$. For example, the dielectric layer can include a bilayer of Mo and $MoO_x$ (for example, with $0<x<3$), a bilayer of $MoO_x$ and $MoO_2$ (for example, with $2<x<3$), a bilayer of $MoO_x$ (for example, with $0<x<3$ or $2<x<3$) and $MoO_3$, or a bilayer of Mo and $MoO_3$. The thickness of the dielectric layer can be between 2 nm and 100 nm. An optional treatment can be performed after depositing the dielectric layer. The treatment can include a plasma treatment or a high temperature treatment in an oxidizing or reducing ambient. For example, the treatment can include a rapid thermal oxidation at 300 C. in oxygen ambient. The treatment can be performed in-situ after the deposition of the first electrode layer. The treatment can include an oxygen radical anneal, e.g., plasma anneal in an oxygen ambient. In operation 2320, a second electrode layer is formed on the dielectric layer.

Figure 24:
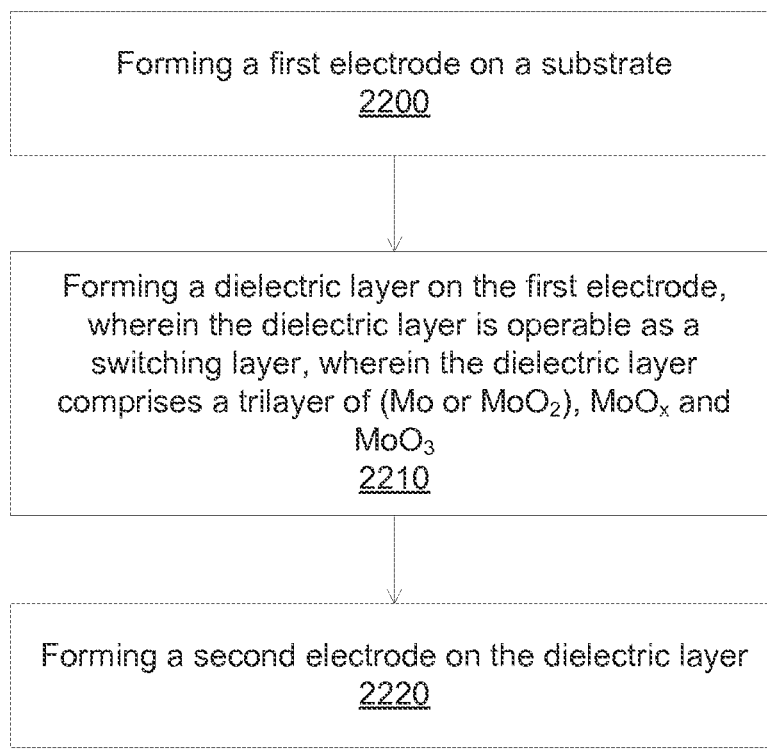
FIG. 24 illustrates a flowchart for forming a memory element according to some embodiments.

FIG. 24 illustrates a flowchart for forming a memory element according to some embodiments. The flowchart describes techniques for forming a memory element generally including two electrodes and one or more dielectric layers disposed therebetween. The dielectric layers can include one or more charge layers at the interface with the electrodes to generate internal electric field.

In operation 2400, a first electrode layer is formed. The first electrode layer can be formed on a substrate, for example, a silicon substrate that may include one or more layers already formed thereon. In operation 2410, a dielectric layer can be formed on the first electrode. The dielectric layer can be operable as a switching layer. The dielectric layer can include a trilayer of $MoO_x$, Mo, $MoO_2$ and $MoO_3$. For example, the dielectric layer can include a trilayer of Mo, $MoO_x$ (for example, with $0<x<3$), $MoO_3$, or a trilayer of $MoO_2$, $MoO_x$ (for example, with $2<x<3$) and $MoO_3$. The thickness of the dielectric layer can be between 2 nm and 100 nm. An optional treatment can be performed after depositing the dielectric layer. The treatment can include a plasma treatment or a high temperature treatment in an oxidizing or reducing ambient. For example, the treatment can include a rapid thermal oxidation at 300 C. in oxygen ambient. The treatment can be performed in-situ after the deposition of the first electrode layer. The treatment can include an oxygen radical anneal, e.g., plasma anneal in an oxygen ambient. In operation 2420, a second electrode layer is formed on the dielectric layer.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A resistive random access memory cell comprising:
    a first layer operable as a first electrode;
    a second layer operable as a resistive switching layer configured to switch between a low resistive state and a high resistive state when a switching voltage is applied to the second layer,
        the second layer disposed on the first layer,
        wherein the second layer comprises molybdenum oxide having mobile $O^{2-}$ ions configured to move within the second layer thereby changing a composition profile of the second layer when the switching voltage is applied to the second layer,
        wherein the composition profile of the second layer is less uniform when the second layer is in the high resistive state than when the second layer is in the low resistive state,
        wherein a as-deposited atomic ratio of oxygen to molybdenum is between 2 and 3; and
    a third layer operable as a second electrode and disposed on the second layer.

2. A resistive random access memory cell as in claim 1, wherein the as-deposited atomic ratio of oxygen to molybdenum is substantially constant within the second layer.

3. A resistive random access memory cell as in claim 1, wherein the as-deposited atomic ratio of oxygen to molybdenum is greater than 2.5.

4. A resistive random access memory cell as in claim 1, wherein the as-deposited atomic ratio of oxygen to molybdenum is gradually graded in the second layer.

5. A resistive random access memory cell as in claim 1, wherein the as-deposited atomic ratio of oxygen to molybdenum is stepwise graded in the second layer.

6. A resistive random access memory cell as in claim 1, further comprising a fourth layer disposed adjacent to the second layer, wherein the fourth layer comprises molybdenum oxide, wherein the as-deposited atomic ratio of oxygen to molybdenum is equal or less than 2.

7. A resistive random access memory cell as in claim 1, further comprising a fifth layer disposed adjacent to the second layer, wherein the as-deposited fifth layer comprises molybdenum.

8. A resistive random access memory cell as in claim 1, further comprising a sixth layer disposed adjacent to the second layer, the as-deposited sixth layer comprising molybdenum trioxide ($MoO_3$).

9. A resistive random access memory cell as in claim 1, further comprising
    a seventh layer disposed adjacent to the second layer, wherein the as deposited seventh layer comprises molybdenum (Mo) or molybdenum dioxide ($MoO_2$); and
    an eighth layer disposed adjacent to the second layer and at opposite side of the seventh layer, wherein the as-deposited eighth layer comprises molybdenum trioxide ($MoO_3$).

10. A resistive random access memory cell as in claim 1, wherein a thickness of the second layer is between 2 and 100 nm.

11. A resistive random access memory cell as in claim 1, wherein molybdenum oxide of the second layer comprises forms Magenli phases.

12. A resistive random access memory cell as in claim 11, wherein the Magenli phases are redistributed within the second layer when the second layer switches between the low resistive state and the high resistive state.

13. A resistive random access memory cell as in claim 1, wherein the as-deposited atomic ratio of oxygen to molybdenum is greater than 2.75.

14. A resistive random access memory cell as in claim 1, wherein the as-deposited atomic ratio of oxygen to molybdenum is greater than 2.9.

* * * * *